United States Patent
Jung

(10) Patent No.: US 9,865,544 B2
(45) Date of Patent: Jan. 9, 2018

(54) SEMICONDUCTOR DEVICE LAYOUT HAVING A POWER RAIL

(71) Applicant: SAMSUNG ELECTRONICS CO., LTD., Suwon-si, Gyeonggi-do (KR)

(72) Inventor: Jong-Hoon Jung, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/874,916

(22) Filed: Oct. 5, 2015

(65) Prior Publication Data

US 2017/0098608 A1    Apr. 6, 2017

(51) Int. Cl.
| | |
|---|---|
| H01L 23/50 | (2006.01) |
| H01L 23/528 | (2006.01) |
| H01L 23/522 | (2006.01) |
| H01L 27/02 | (2006.01) |
| H01L 29/417 | (2006.01) |

(52) U.S. Cl.
CPC .......... *H01L 23/5286* (2013.01); *H01L 23/50* (2013.01); *H01L 23/5226* (2013.01); *H01L 27/0207* (2013.01); *H01L 29/41758* (2013.01)

(58) Field of Classification Search
None
See application file for complete search history.

(56) References Cited

U.S. PATENT DOCUMENTS

| | | | |
|---|---|---|---|
| 7,368,767 B2* | 5/2008 | Kinoshita | ........... G06F 17/5068 257/202 |
| 7,456,447 B2 | 11/2008 | Tatsumi | |
| 8,159,013 B2 | 4/2012 | Nishimura et al. | |
| 8,507,957 B2 | 8/2013 | Hou et al. | |
| 8,648,392 B2 | 2/2014 | Nishimura et al. | |
| 2006/0268594 A1* | 11/2006 | Toda | ................... G11C 13/0011 365/100 |
| 2007/0096154 A1 | 5/2007 | Shimbo et al. | |
| 2008/0061381 A1* | 3/2008 | Hashimoto | ......... G11C 11/4125 257/393 |
| 2008/0169487 A1 | 7/2008 | Shimbo et al. | |
| 2012/0299065 A1* | 11/2012 | Shimizu | .............. H01L 27/0207 257/211 |
| 2013/0056803 A1* | 3/2013 | Nakanishi | ........... H01L 27/0207 257/288 |
| 2013/0280905 A1* | 10/2013 | Doman | ............... H01L 27/0207 438/618 |
| 2014/0233330 A1 | 8/2014 | Ko et al. | |

FOREIGN PATENT DOCUMENTS

| | | |
|---|---|---|
| JP | 2009-272340 | 11/2009 |
| JP | 2012-227395 | 11/2012 |

* cited by examiner

*Primary Examiner* — Marc Armand
*Assistant Examiner* — Shannon Yi
(74) *Attorney, Agent, or Firm* — F. Chau & Associates, LLC

(57) ABSTRACT

A semiconductor device is provided as follows. An active region extends along a first direction. A gate line overlaps the active region and extending along a second direction intersecting the first direction. A power rail has a main pattern extending along the first direction and a sub-pattern branching off from the main pattern to extend along the second direction. A first source/drain contact, electrically connected to the power rail, overlaps the active region and the sub-pattern.

18 Claims, 23 Drawing Sheets

8

12

1200

1300

1400

SEMICONDUCTOR DEVICE LAYOUT HAVING A POWER RAIL

BACKGROUND

1. Technical Field

The present inventive concept relates to a semiconductor device having a power rail.

2. Discussion of the Related Art

A logic cell of a semiconductor device is an integrated structure of a semiconductor circuit for performing a specific function. The logic cell may be pre-designed in various ways as an individual module and optimized to satisfy a plurality of specific constraints. The pre-designed logic cell is called a standard cell. A desired circuit may be designed using various standard cells.

Standard cells are subject to the constraints of design rules for efficient space utilization. As miniaturization and integration processes of semiconductor devices develop, critical dimensions of design rules are gradually being reduced. Accordingly, securing a margin of a ground rule, that is, securing a minimum distance between internal patterns is becoming an important challenge to prevent a short circuit between the patterns. The minimum distance can be secured only when constraints such as dispersion uniformity of critical dimensions and line edge roughness (LER) of patterns are satisfied.

SUMMARY

According to an example embodiment of the present inventive concept, a semiconductor device is provided as follows. An active region extends along a first direction. A gate line overlaps the active region and extending along a second direction intersecting the first direction. A power rail has a main pattern extending along the first direction and a sub-pattern branching off from the main pattern to extend along the second direction. A first source/drain contact, electrically connected to the power rail, overlaps the active region and the sub-pattern.

According to an example embodiment of the present inventive concept, a semiconductor device is provided as follows. An active region extends along a first direction. A gate line overlaps the active region and extends along a second direction intersecting the first direction. A power rail has a main pattern extending along the first direction and a recessed region recessed from the main pattern. A first source/drain contact, electrically connected to the power rail, overlaps the active region and the main pattern. The recessed region is spaced apart from the first source/drain contact.

According to an example embodiment of the present inventive concept, a semiconductor device having multilevel layers is provided as follows. A first level layer has an active region. A second level layer has a first source/drain contact and a power rail. The power rail includes a main pattern and a sub-pattern protruding from the main pattern. A third level layer has a metal interconnect overlapping the active region and the first source/drain contact when viewed from the above of the semiconductor device. The third level layer is higher than the first level layer and the second level layer. The second level layer is higher than the first level layer.

BRIEF DESCRIPTION OF THE DRAWINGS

These and other features of the inventive concept will become more apparent by describing in detail example embodiments thereof with reference to the accompanying drawings of which.

Figure 1:
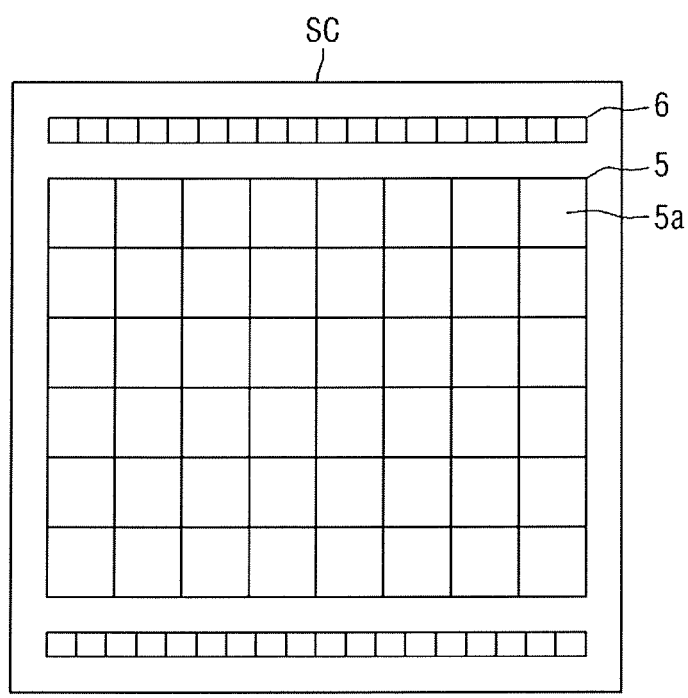
FIG. 1 is a layout view of a semiconductor chip including standard cells.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF THE EMBODIMENTS

Example embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

As the design of semiconductor integrated circuits (ICs) becomes complicated, a semi-custom design method, which is a computer-based automatic design method, is being used. The semi-custom design method is a method of developing a desired circuit by preparing a plurality of standard basic circuits (logic cells) and automatically designing these logic cells using a computer. One example of the semi-custom design method is a design method using standard cells.

In the standard cell design method, a complicated logic circuit formed by combining basic circuits is optimally designed and registered in a database of a computer as a standard cell. Then, when a semiconductor IC is actually designed, various standard cells registered in the database are combined to produce a desired circuit. The standard cells are uniform in height, and an IC may be designed by arranging appropriate standard cells in a plurality of columns.

With the increasing integration density of a semiconductor IC, a reduction in the standard cell size is being required. Generally, if transistors included in each standard cell are reduced in size, the standard cell size may be reduced. However, if the transistors are equally reduced in size, the transistors may fail to have a desired function. In addition, since a standard cell, by its nature, uses a lowest metal only, the complexity of the lowest metal increases, thereby increasing the size of the standard cell.

However, if a standard cell layout according to the present inventive concept is employed, the standard cell size may be reduced, and a plurality of gates included in a cell may be picked up simultaneously. In addition, a plurality of pins in the cell may be implemented to be accessible. Further, since multiple layers are applied to a metal adjacent to a power rail and a metal connected to an active region, a track loss may be prevented. Also, this multilayer structure may prevent a short circuit between a contact and a metal. Moreover, it is possible to reduce power rail resistance and increase capacitance, thereby reducing a drop in power supply voltage.

Figure 2:
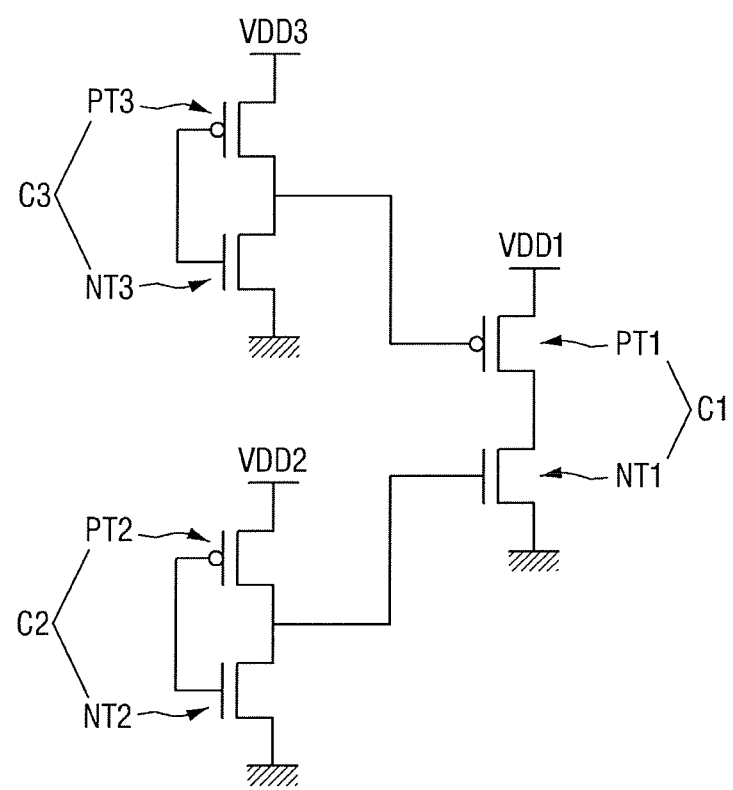
FIG. 2 is a circuit diagram illustrating the operation of one standard cell.

FIG. 1 is a layout view of a semiconductor chip SC including standard cells 5a. FIG. 2 is an example circuit diagram of one standard cell 5a.

Referring to FIG. 1, a standard cell region 5 and an input/output cell region 6 may be formed in a surface of the semiconductor chip SC, and a plurality of standard cells 5a may be formed in the surface of the semiconductor chip SC. Pads may be formed in the input/output cell region 6 to receive signals from an external source and output signals to an external destination. The input/output cell region 6 may be formed adjacent to the standard cell region 5.

The standard cells 5a may be arranged in the standard cell region 5 in a matrix pattern. A system-on-chip (SOC) may use a standard cell library, and a central processing unit (CPU), a random access memory (RAM), first-in first-out (FIFO), smaller computer system interface (SCSI), sea of gate (SoC), etc. may be formed in the standard cell region 5.

An example circuit formed in each of the standard cells 5a will be described with reference to FIG. 2. In FIG. 2, a partial circuit of a buffer formed in the standard cell 5a is illustrated as an example. The partial circuit includes an output terminal and a driver. The output terminal may include a first complementary metal oxide semiconductor (CMOS) inverter C1 which includes a first p-channel metal oxide semiconductor (PMOS) transistor PT1 and a first n-channel metal oxide semiconductor (NMOS) transistor NT1. The driver may include a second CMOS inverter C2 which includes a second PMOS transistor PT2 and a second NMOS transistor NT2 and a third CMOS inverter C3 which includes a third PMOS transistor PT3 and a third NMOS transistor NT3.

An output of the second CMOS inverter C2 which includes the second PMOS transistor PT2 and the second NMOS transistor NT2 may be input to the first NMOS transistor NT1, and an output of the third CMOS inverter C3 which includes the third PMOS transistor PT3 and the third NMOS transistor NT3 may be input to the first PMOS transistor PT1.

In the circuit of FIG. 2, when a high-level signal is input to the third CMOS inverter C3 and the second CMOS inverter C2, the first CMOS inverter C1 disposed at the output terminal outputs a high-level signal. When a low-level signal is input to the third CMOS inverter C3 and the second CMOS inverter C2, the first CMOS inverter C1 disposed at the output terminal outputs a low-level signal.

If a low-level signal is input to the third CMOS inverter C3 and if a high-level signal is input to the second CMOS inverter C2, the output of the first CMOS inverter C1 may be put in a floating state, that is, in a high-impedance state.

Figure 3:
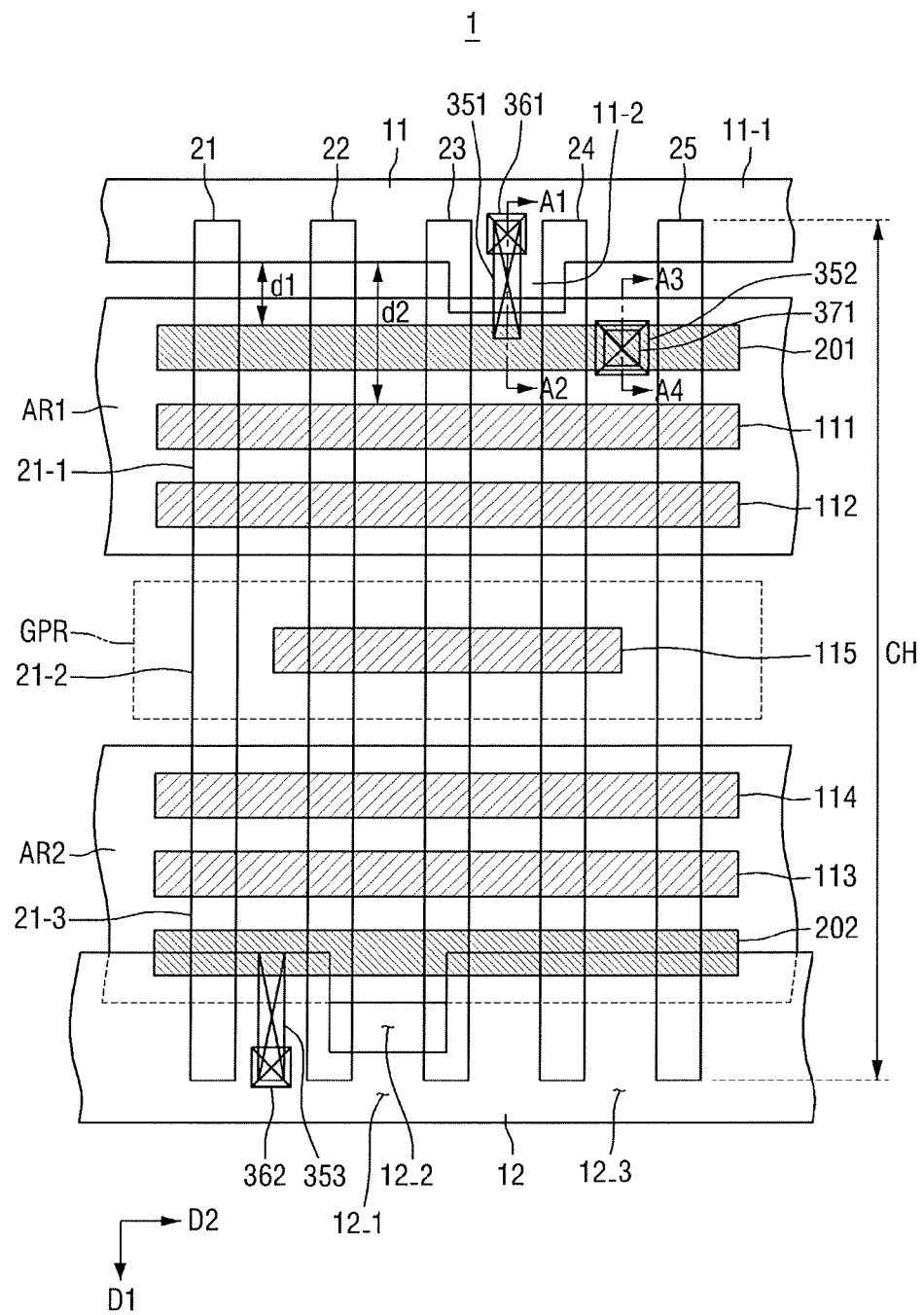
FIG. 3 is a layout view of a semiconductor device according to an example embodiment of the present inventive concept.
Figure 4:
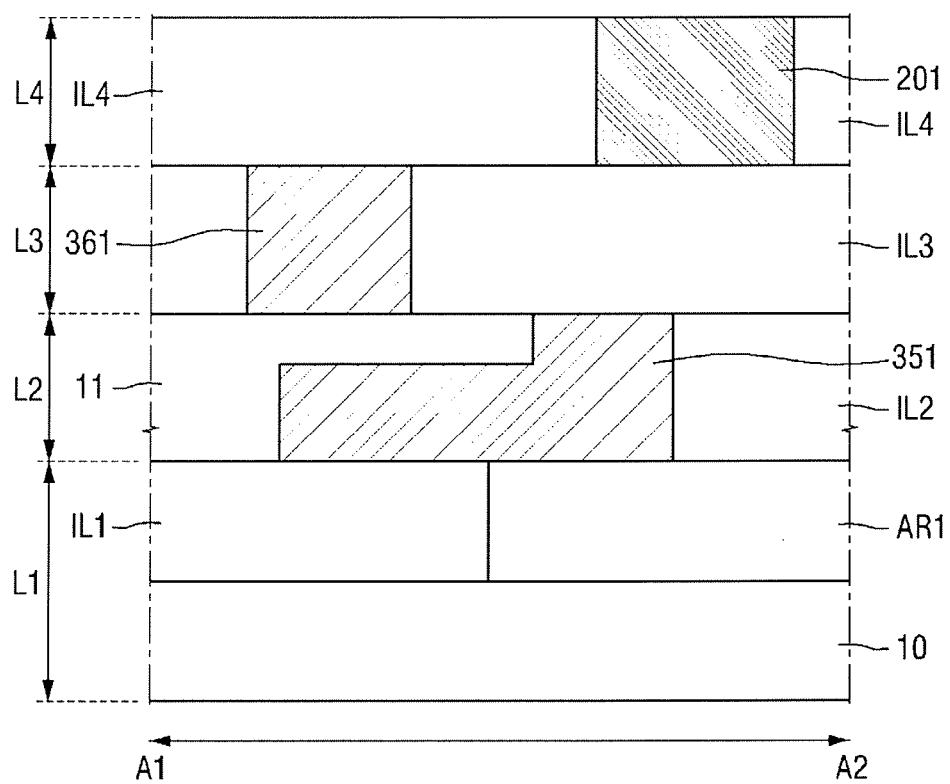
FIG. 4 is a cross-sectional view taken along line A1-A2 of FIG. 3.
Figure 5:
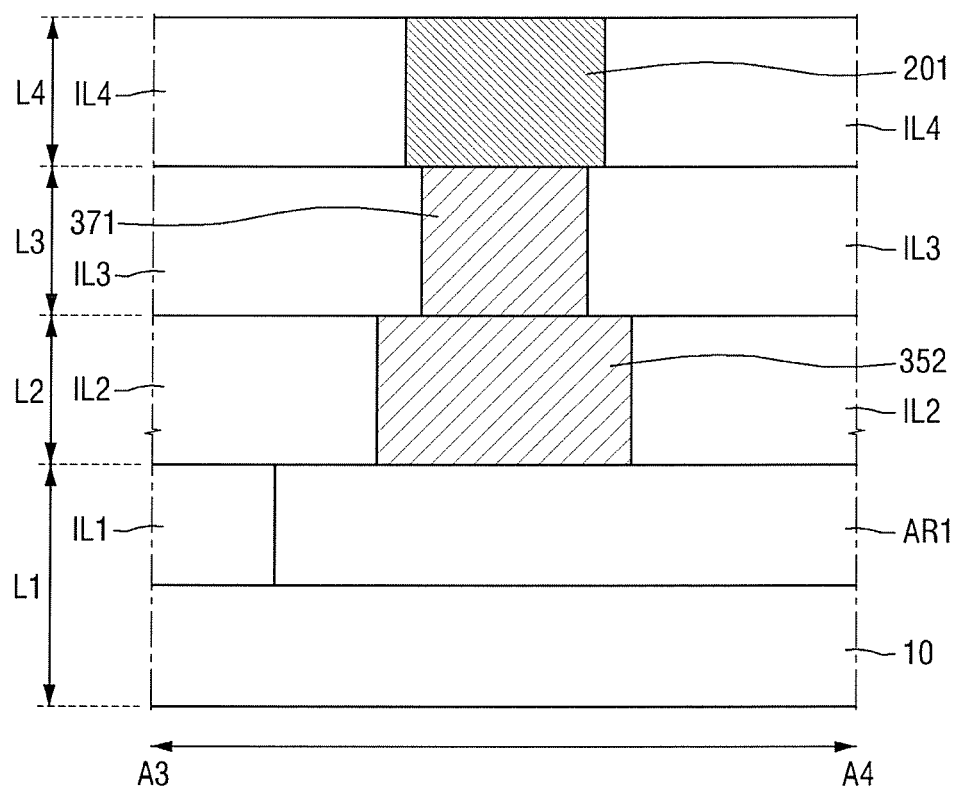
FIG. 5 is a cross-sectional view taken along line A3-A4 of FIG. 3.

FIG. 3 is a layout view of a semiconductor device 1 according to an example embodiment of the present inventive concept. FIG. 4 is a cross-sectional view taken along line A1-A2 of FIG. 3. FIG. 5 is a cross-sectional view taken along line A3-A4 of FIG. 3.

Referring to FIGS. 3 through 5, the semiconductor device 1 includes a substrate 10, a first active region AR1, a second active region AR2, a gate pickup region GPR, a first power rail 11, a second power rail 12, first through fifth gate lines 21 through 25, and first through seventh metal interconnects 111 through 115, 201 and 202.

Each semiconductor device according to the present inventive concept which will be described below may operate as a planar transistor, a buried cell array transistor (SCAT), or a fin-type transistor using the above elements.

The substrate 10 may be, for example, a semiconductor substrate. The substrate 10 may include one of silicon (Si), strained Si, Si alloy, silicon carbide (SiC), silicon germanium (SiGe), silicon germanium carbide (SiGeC), germanium (Ge), Ge alloy, gallium arsenide (GaAs), indium arsenide (InAs), III-V semiconductor and II-VI semiconductor, a combination thereof, or a stack thereof. In an example embodiment, the substrate 10 may be an organic plastic substrate. Hereinafter, for the convenience of description, it is assumed that the substrate 10 is made of silicon.

The substrate 10 may be of a p type or an n type. In an example embodiment of the present inventive concept, the substrate 10 may be an insulating substrate, for example, a silicon-on-insulator (SOI) substrate. When the SOI substrate is used, the semiconductor device 1 may operate faster compared with a semiconductor device formed of the semiconductor substrate.

The substrate 10 may include active regions AR1 and AR2. The active regions AR1 and AR2 may extend along a second direction D2. The active regions AR1 and AR2 may be formed in plural. The active regions AR1 and AR2 may be separated from each other in a first direction D1 which intersects the second direction D2. For example, the active regions AR1 and AR2 may include the first active region AR1 and the second active region AR2. The second active region AR2 may be spaced apart from the first active region AR1. For example, the second active region AR2 may be disposed parallel to the first active region AR1, but the present inventive concept is not limited thereto.

Each of the first active region AR1 and the second active region AR2 may be part of the substrate 10 or may include an epitaxial layer grown from the substrate 10. The first active region AR1 and the second active region AR2 may include Si or SiGe. In addition, the first active region AR1 and the second active region AR2 may include n-type or p-type impurities.

The gate pickup region GPR may be formed between the first active region AR1 and the second active region AR2. The gate pickup region GPR may extend along the second direction D2. A gate pickup insulating layer and a gate pickup electrode may additionally be formed in the gate pickup region GPR. The gate pickup insulating layer may include silicon oxide. In addition, the gate pickup electrode may include a conductor such as doped polycrystalline silicon. For example, the gate pickup insulating layer may completely cover lower and side surfaces of the gate pickup electrode.

The first through fifth gate lines 21 through 25 may be formed on the first and second active regions AR1 and AR2. The first through fifth gate lines 21 through 25 may extend along the first direction D1 to intersect the first and second active regions AR1 and AR2. The first through fifth gate lines 21 through 25 may be separated from each other in the second direction D2. For example, the first through fifth gate lines 21 through 25 may be spaced apart from each other in a predetermined distance. In an example embodiment of the present inventive concept, a different number of gate lines from the number of gate lines illustrated in FIG. 3 may be formed.

The first through fifth gate lines 21 through 25 may be made of a metal with high conductivity, but the present inventive concept is not limited thereto. For example, the first through fifth gate lines 21 through 25 may be made of a non-metal such as polysilicon.

The first through fifth gate lines 21 through 25 may have substantially the same structure, but the present inventive concept is not limited thereto. Hereinafter, the first gate line 21 only will be described based on the assumption that the first through fifth gate lines 21 through 25 have substantially the same structure.

The first gate line 21 may extend along the first direction D1, crossing the first active region AR1, the gate pickup region GPR, and the second active region AR2. The first gate line 21 may include a first gate part 21_1 which overlaps the first active region AR1, a second gate part 21_2 which overlaps the gate pickup region GPR, and a third gate part 213 which overlaps the second active region AR2. The first through third gate parts 21_1 through 21_3 may be formed integrally to constitute the gate line 21.

The first power rail 11 may be formed on an end of each of the first through fifth gate lines 21 through 25 to overlap the end of each of the first through fifth gate lines 21 through 25. The second power rail 12 may be formed on the other end of each of the first through fifth gate lines 21 through 25 to overlap the other end of each of the first through fifth gate lines 21 through 25. The first power rail 11 may extend along the second direction D2. The second power rail 12 may extend along the second direction D2 and may be separated from the first power rail 11 in the first direction D1.

The first power rail 11 may include a main pattern 11_1 which extends along the second direction D2 and a sub-pattern 11_2 which branches off from the main pattern 11_1 and protrudes in the first direction D1. The main pattern 11_1 extending along the second direction D2 may be adjacent to the sixth metal interconnect 201, and the sub-pattern 11_2 may be a region of the main pattern 11_1 which protrudes in the first direction D1. The main pattern 11_1 and the sub-pattern 11_2 may form a 'T' shape.

A first source/drain contact 351 may be formed to overlap a region where the sub-pattern 11_2 is formed. A width of the sub-pattern 11_2 in the second direction D2 may be greater than that of the first source/drain contact 351 in the second direction D2. The sub-pattern 11_2 may overlap the third gate line 23 and the fourth gate line 24, and the first source/drain contact 351 may overlap none of the first through fifth gate lines 21 through 25.

The first power rail 11 may be disposed in the same layer as the first source/drain contact 351, and an upper surface of the first power rail 11 may lie in the same plane with an upper surface of the first source/drain contact 351.

The first source/drain contact 351 may overlap the main pattern 11_1 and the sub-pattern 112 of the first power rail 11. A protruding part (i.e., the sub-pattern 11_2) of the first power rail 11 and the first source/drain contact 351 may be electrically connected to form a common node. In addition, a node separated from the first power rail 11 may be formed by forming a second source/drain contact 352 which does not overlap the main pattern 11_1 and the sub-pattern 11_2 of the first power rail 11.

The first source/drain contact 351 and the second source/drain contact 352 may be formed in a lower layer than the sixth metal interconnect 201. The first source/drain contact 351 and the second source/drain contact 352 need not directly contact the sixth metal interconnect 201. A via contact 361 may be formed on the first source/drain contact 351 without being in direct contact with the first source/drain contact 351. In addition, a via contact 371 may be formed between the sixth metal interconnect 201 and the second source/drain contact 352 to electrically connect the sixth metal interconnect 201 and the second source/drain contact 352.

The second power rail 12 may include a region 12_1 recessed from a main pattern 12_3 extending along the second direction D2. The second power rail 12 may overlap the seventh metal interconnect 202, and the recessed region 12_1 need not overlap the seventh metal interconnect 202. A source/drain contact or a space for metal interconnect routing may be formed in a region 12_2 surrounded by the recessed region 12_1 and the main pattern 12_3. The main pattern 12-3 of the second power rail 12 may be formed as wide as possible so as to reduce the resistance of the second power rail 12 and increase the capacitance of the second power rail 12. The width of the second power rail 12 may be measured along the first direction D1.

A third source/drain contact 353 may be formed to overlap the main pattern 12_3 of the second power rail 12. The main pattern 12_3 of the second power rail 12 may overlap the first through fifth gate lines 21 through 25, and the third source/drain contact 353 may overlap none of the first through fifth gate lines 21 through 25.

The second power rail 12 may be disposed in the same layer as the third source/drain contact 353, and an upper surface of the second power rail 12 may lie in the same plane with an upper surface of the third source/drain contact 353.

The third source/drain contact 353 may be electrically connected to the main pattern of the second power rail 12 to form a common node. In addition, a node separated from the second power rail 12 can be formed by forming a source/drain contact which does not overlap the main pattern of the second power rail 12. For example, a node separated from the second power rail 12 may be formed by forming a source/drain contact at the region 12-2.

The third source/drain contact 353 may be formed in a lower layer than the seventh metal interconnect 202. The third source/drain contact 353 need not directly contact the seventh metal interconnect 202. A via contact 362 may be formed between the seventh metal interconnect 202 and the third source/drain contact 353 to electrically connect the seventh metal interconnect 202 and the third source/drain contact 353.

A cell height CH of a standard cell may be determined by the first through fifth gate lines 21 through 25 which are disposed on the first active region AR1, the gate pickup region GPR and the second active region AR2 to overlap the first active region AR1, the gate pickup region GPR and the second active region AR2. In the example of FIG. 3, the standard cell may have seven tracks.

The semiconductor device 1 may include the first through seventh metal interconnects 111 through 115, 201 and 202 used for signal routing. The fifth metal interconnect 115 may be disposed on the gate pickup region GPR and electrically connect the second through fourth gate lines 22 through 24. The first and second metal interconnects 111 and 112 may be disposed on the first active region AR1, and the third and fourth metal interconnects 113 and 114 may be disposed on the second active region AR2.

The sixth metal interconnect 201 may be disposed closer to the first power rail 11 than the first through fifth metal interconnects 111 through 115 and in a higher layer than the first through fifth metal interconnects 111 through 115. In addition, the seventh metal interconnect 202 may be disposed closer to the second power rail 12 than the first through fifth metal interconnects 111 through 115 and in a higher layer than the first through fifth metal interconnects 111 through 115.

Referring to FIG. 4, a first layer L1 may be formed on the substrate 10, and the first active region AR1 and a first interlayer insulating film IL1 may be formed in the first layer L1. The first through fifth gate lines 21 through 25 may also be formed in the first layer L1.

The first interlayer insulating film IL1 may be used for electrical insulation between the first active region AR1 and the first power rail 11. The first interlayer insulating film IL1 may be made of silicon oxide such as borosilicate glass (BSG), phosphosilicate glass (PSG), borophosphosilicate glass (BPSG), updoped silicate glass (USG), tetraethylorthosilicate glass (TEOS), or high density plasma-chemical vapor deposition (HDP-CVD) oxide. An upper surface of the first active region AR1 and an upper surface of the first interlayer insulating film IL1 may lie in the same plane.

A second layer L2 may be formed on the first layer L1, and the first power rail 11, the first source/drain contact 351 and a second interlayer insulating film IL2 may be formed in the second layer L2. The first through fifth metal interconnects 111 through 115 may also be formed in the second layer L2. For example, the first through fifth gate lines 21 through 25 may be formed in the first layer L1, and the first through fifth metal interconnects 111 through 115 may be formed in the second layer L2. Therefore, the first through fifth metal interconnects 111 through 115 may be formed in a higher layer than the first through fifth gate lines 21 through 25.

The second interlayer insulating film IL2 may be used for electrical insulation between the first source/drain contact 351 and the sixth metal interconnect 201. Like the first interlayer insulating film ILL the second interlayer insulating film IL2 may be made of silicon oxide such as BSG, PSG, BPSG, USG, TEOS, or HDP-CVD oxide. The upper surface of the first source/drain contact 351, an upper surface of the second source/drain contact 352, and an upper surface of the second interlayer insulating film IL2 may lie in the same plane.

A third layer L3 may be formed on the second layer L2, and the via contacts 361 and 371 and a third interlayer insulating film IL3 may be formed in the third layer L3.

The first through fifth metal interconnects 111 through 115 may be formed in the second layer L2, and the sixth and seventh metal interconnects 201 and 202 may be formed in a fourth layer L4. Therefore, the sixth metal interconnect 201 and the seventh metal interconnect 202 may be formed in a higher layer than the first through fifth metal interconnects 111 through 115.

The sixth metal interconnect 201 is a metal interconnect disposed adjacent to the first power rail 11, and the seventh metal interconnect 202 is a metal interconnect disposed adjacent to the second power rail 12. Referring to FIG. 3, since the sixth metal interconnect 201 and the seventh metal interconnect 202 are disposed substantially symmetrical to each other, the description of the sixth metal interconnect 201 applies substantially the same to the seventh metal interconnect 202.

Since the sixth metal interconnect 201 is disposed in a higher layer than the first through fifth metal interconnects 111 through 115, the first source/drain contact 351 which is formed on the first active region AR1 at a location that overlaps the sixth metal interconnect 201 may avoid a short circuit between the first source/drain contact 351 and the sixth metal interconnect 201. The multi-level structure of FIG. 4 may reduce the probability of forming a short circuit between the first source/drain contact 351 and the sixth metal interconnect 201.

In addition, since the probability of a short circuit between the first metal interconnect 111 and the sixth metal interconnect 201 is reduced, the first metal interconnect 111 and the sixth metal interconnect 201 may be made of the same material. For example, both the first metal interconnect 111 and the sixth metal interconnect 201 may be made of copper (Cu). However, the present inventive concept is not limited thereto, and the first metal interconnect 111 and the sixth metal interconnect 201 may include different materials. For example, the first metal interconnect 11 may include tungsten (W), and the sixth metal interconnect 201 may include Cu.

A fourth interlayer insulating film IL4 may be used for electrical insulation between the via contact 361 and the sixth metal interconnect 201. Like the first interlayer insulating film ILL the fourth interlayer insulating film IL4 may be made of silicon oxide such as BSG, PSG, BPSG, USG, TEOS, or HDP-CVD oxide. An upper surface of the sixth metal interconnect 201 may lie in the same plane with an upper surface of the fourth interlayer insulating film IL4.

Referring to FIG. 5, the via contact 371 may be formed between the second source/drain contact 352 and the sixth metal interconnect 201 to electrically connect the second source/drain contact 352 and the sixth metal interconnect 201. Since the second source/drain contact 352 is separated from the first power rail 11, the first power rail 11 and the sixth metal interconnect 201 need not be electrically connected to each other.

According to some example embodiments, the first power rail 11 may be a power supply voltage (VDD) rail, and the second power rail 12 may be a ground voltage (GND) rail. In this case, the first active region AR1 may include a p-type impurity region, and the second active region AR2 may include an n-type impurity region.

In addition, the first power rail 11 may be electrically connected to the first source/drain contact 351 to supply power to the semiconductor device 1.

In the semiconductor device 1, the first through fifth metal interconnects 111 through 115 formed in the second layer L2 and the sixth and seventh metal interconnects 201 and 202 formed in the fourth layer L4 may be used for signal routing. Since the first through fifth metal interconnects 111 through 115 are formed in the second layer L2 and the sixth and seventh metal interconnects 201 and 202 are formed in the fourth layer L4, the first through fifth metal interconnects 111 through 115 located in a lower layer may set signal paths not only in the first direction D1 but also in the second direction D2 to increase routability.

Likewise, the sixth metal interconnect 201 and the seventh metal interconnect 202 may set signal paths not only in the first direction D1 but also in the second direction D2 to increase routability.

In the semiconductor device 1 according to an example embodiment of the present inventive concept, the shapes of the first power rail 11 and the second power rail 12 are modified, thereby scaling down standard cells, reducing the resistance of the first power rail 11 and the second power rail 12, and increasing the capacitance of the first power rail 11 and the second power rail 12. Accordingly, a drop in power supply voltage may be reduced.

Semiconductor devices according to example embodiments of the present inventive concept will hereinafter be described.

Figure 6:
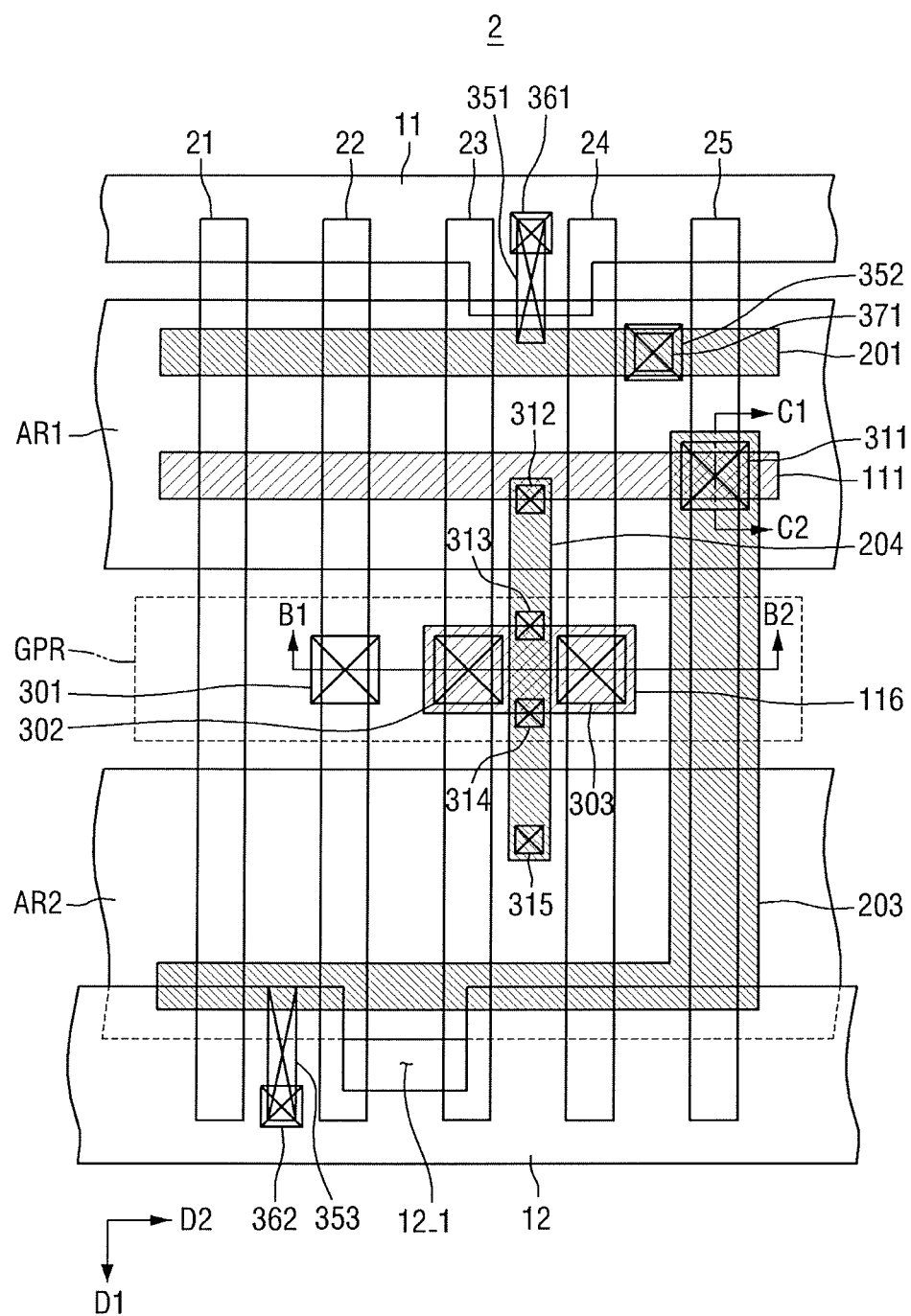
FIG. 6 is a layout view of a semiconductor device according to an example embodiment of the present inventive concept.
Figure 7:
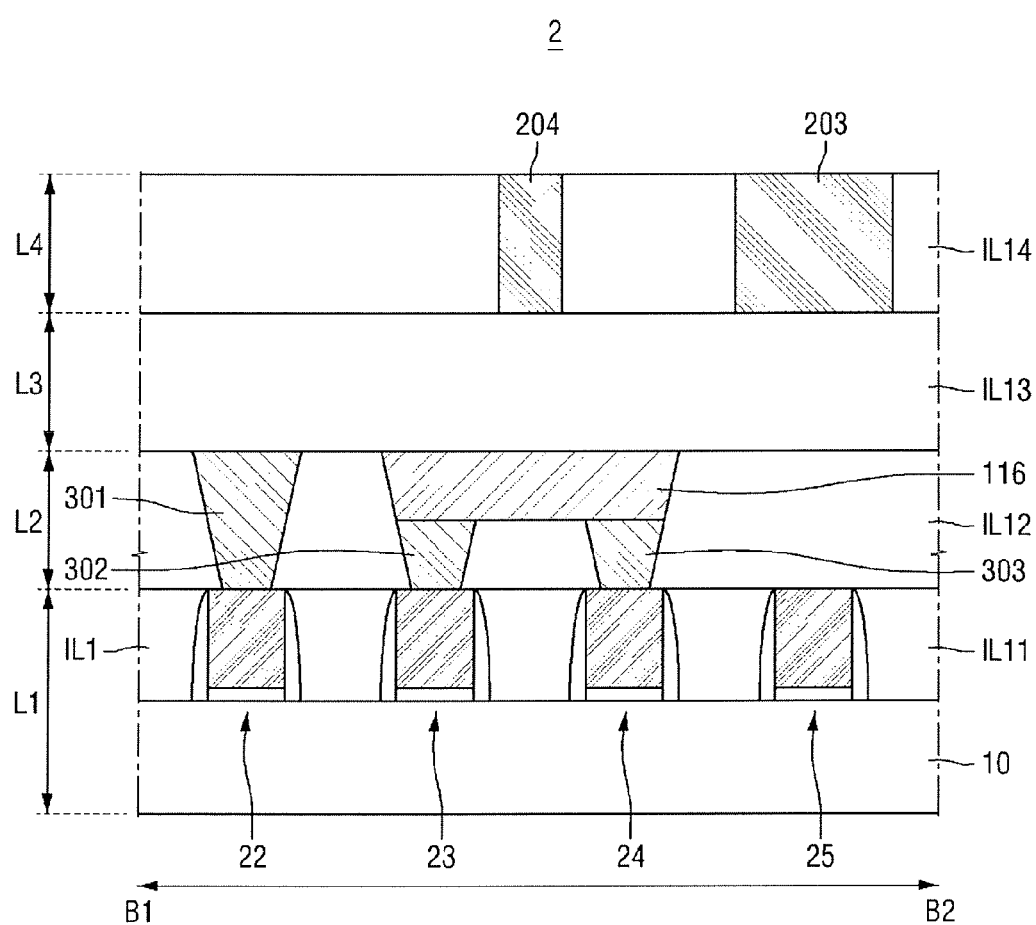
FIG. 7 is a cross-sectional view taken along line B1-B2 of FIG. 6.
Figure 8:
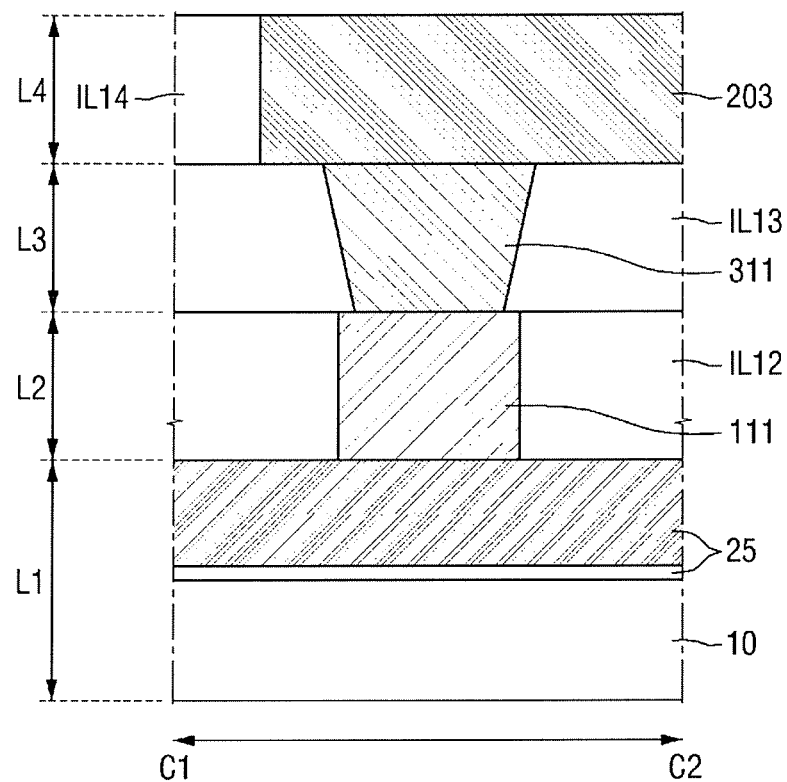
FIG. 8 is a cross-sectional view taken along line C1-C2 of FIG. 6.

FIG. 6 is a layout view of a semiconductor device 2 according to an example embodiment of the present inventive concept. FIG. 7 is a cross-sectional view taken along line B1-B2 of FIG. 6. FIG. 8 is a cross-sectional view taken along line C1-C2 of FIG. 6. For simplicity, a description of elements substantially identical to those of the semiconductor device 1 will be omitted.

Referring to FIGS. 6 through 8, the semiconductor device 2 includes a substrate 10, a first active region AR1, a second active region AR2, a gate pickup region GPR, a first power rail 11, a second power rail 12, first through fifth gate lines 21 through 25, a first metal interconnect 111, a sixth metal interconnect 201, an eighth metal interconnect 203, a ninth metal interconnect 204, first through third gate contacts 301 through 303, first through third source/drain contacts 351 through 353, and via contacts 311 through 315, 361, 362 and 371.

The substrate 10 may be, for example, a semiconductor substrate. The substrate 10 may include at least one of Si, strained Si, Si alloy, SiC, SiGe, SiGeC, Ge, Ge alloy, GaAs, InAs, III-V semiconductor and II-VI semiconductor, a combination thereof, or a stack thereof. In an example embodiment, the substrate 10 may be an organic plastic substrate instead of the semiconductor substrate.

The substrate 10 may be of a p type or an n type. In some example embodiments of the present inventive concept, the substrate 10 may be an insulating substrate, specifically, a silicon-on-insulator (SOI) substrate. When the SOI substrate is used, the delay time in the operation of the semiconductor device 2 may be reduced.

The substrate 10 may include an active region (AR1, AR2). The active regions AR1 and AR2 may extend along a second direction D2. The active regions AR1 and AR2 may be formed in plural. The active regions AR1 and AR2 may be separated from each other in a first direction D1 which intersects the second direction D2. For example, the active regions AR1 and AR2 may include the first active region AR1 and the second active region AR2. The second active region AR2 may be separated from the first active region AR1. For example, the second active region AR2 may be disposed parallel to the first active region AR1, but the present inventive concept is not limited thereto.

Each of the first active region AR1 and the second active region AR2 may be part of the substrate 10 or may include an epitaxial layer grown from the substrate 10. The first active region AR1 and the second active region AR2 may include Si or SiGe. In addition, the first active region AR1 and the second active region AR2 may include n-type or p-type impurities.

The gate pickup region GPR may be formed between the first active region AR1 and the second active region AR2. The gate pickup region GPR may extend along the second direction D2. A gate pickup insulating layer and a gate pickup electrode may additionally be formed in the gate pickup region GPR. The gate pickup insulating layer may include silicon oxide. In addition, the gate pickup electrode may include a conductor such as doped polycrystalline silicon. For example, the gate pickup insulating layer may completely cover lower and side surfaces of the gate pickup electrode.

The first through fifth gate lines 21 through 25 may be formed on the first and second active regions AR1 and AR2. The first through fifth gate lines 21 through 25 may extend along the first direction D1 to intersect the first and second active regions AR1 and AR2. The first through fifth gate lines 21 through 25 may be separated from each other in the second direction D2. For example, the first through fifth gate lines 21 through 25 may be separated by a predetermined distance in the second direction D2.

The first through fifth gate lines 21 through 25 may be made of a metal with high conductivity, but the present inventive concept is not limited thereto. For example, the first through fifth gate lines 21 through 25 may be made of a non-metal such as polysilicon.

The first power rail 11 may be formed on an end of each of the first through fifth gate lines 21 through 25 to overlap the end of each of the first through fifth gate lines 21 through 25. The second power rail 12 may be formed on the other end of each of the first through fifth gate lines 21 through 25 to overlap the other end of each of the first through fifth gate lines 21 through 25. The first power rail 11 may extend along the second direction D2. The second power rail 12 may extend along the second direction D2 and may be separated from the first power rail 11 in the first direction D1.

The semiconductor device 2 may include the first metal interconnect 111, the sixth metal interconnect 201, the eighth metal interconnect 203 and the ninth metal interconnect 204 used for signal routing.

The first metal interconnect 111 may be disposed on the first active region AR1. The sixth metal interconnect 201 may be disposed closer to the first power rail 11 than the first metal interconnect 111. In addition, the sixth metal interconnect 201 may be disposed in a higher layer than the first metal interconnect 111. The eighth metal interconnect 203 may be 'L'-shaped and disposed close to the second power rail 12. In addition, the eighth metal interconnect 203 may be disposed in a higher layer than the first metal interconnect 111.

The ninth metal interconnect 204 may overlap the first active region AR1, the gate pickup region GPR, and the second active region AR2. The ninth metal interconnect 204 may be disposed in a higher layer than the first metal interconnect 111.

For example, the eighth metal interconnect 203 may be electrically connected to the first metal interconnect 111 by the first via contact 311. In an example embodiment, the eighth metal interconnect 203 may be connected electrically to another metal interconnect. In this case, the first metal interconnect 111 and the eighth metal interconnect 203 may be used for signal routing.

Referring to FIGS. 7 and 8, the first gate contact 301 may be formed on the second gate line 22, the second gate contact 302 may be formed on the third gate line 23, and the third gate contact 303 may be formed on the fourth gate line 24. The second gate contact 302 and the third gate contact 303 may be electrically connected by a connection line 116. Signals may be transmitted to the third gate line 23 and the fourth gate line 24 through the connection line 116.

For example, referring to FIG. 7, a first layer L1 may be formed on the substrate 10, and the second through fifth gate lines 22 through 25 and an interlayer insulating film IL11 may be formed in the first layer L1. The interlayer insulating film IL1 may be used to insulate the second through fifth gate lines 22 through 25 from each other. An upper surface of each of the second through fifth gate lines 22 through 25 and an upper surface of the interlayer insulating film IL11 may lie in the same plane.

A second layer L2 may be formed on the first layer L1, and the first through third gate contacts 301 through 303, the connection line 116 and an interlayer insulating film IL12 may be formed in the second layer L2. In addition, the first metal interconnect 111 may be formed in the second layer L2. The interlayer insulating film IL12 may be used to insulate the first through third gate contacts 301 through 303 from each other. The second gate contact 302 and the third gate contact 303 may be electrically connected by the connection line 116. An upper surface of the first gate contact 301, an upper surface of the connection line 116, and an upper surface of the interlayer insulating film IL12 may lie in the same plane.

A third layer L3 may be formed on the second layer L2, and the first via contact 311 and an interlayer insulating film IL13 may be formed in the third layer L3. The first via contact 311 electrically connects the first metal interconnect 111 and the eighth metal interconnect 203. An upper surface of the first via contact 311 and an upper surface of the interlayer insulating film IL13 may lie in the same plane.

A fourth layer L4 may be formed on the third layer L3, and the eighth metal interconnect 203, the ninth metal interconnect 204 and an interlayer insulating film IL14 may be formed in the fourth layer L4. Referring to FIG. 6, the second through fifth via contacts 312 through 315 are formed on the ninth metal interconnect 204. This indicates that four access pins exist.

According to an example embodiment of the present inventive concept, since the sixth metal interconnect 201 and the eighth metal interconnect 203 are formed in a higher layer than the first metal interconnect 111, a semiconductor integrated circuit may be designed without a loss of tracks adjacent to the first power rail 11 and the second power rail 12. In the structure of the semiconductor device 2, at least one via contacts 312 to 315 are placed on the ninth metal interconnect 204. Thus, a multi-access pin required for signal routing may be implemented using the via contacts as access pins. Since the ninth metal interconnect 204 is formed in a higher layer than the first metal interconnect 111 and the connection line 116, a multi-access pin required for signal routing may be implemented without the risk of a short circuit.

In addition, since the third gate line 23 and the fourth gate line 24 are electrically connected by the connection line 116, a multi-gate pickup is formed. Since the connection line 116 and the ninth metal interconnect 204 are formed in different layers, a multi-gate pickup may be implemented.

The interlayer insulating films IL11 through IL14 may be made of silicon oxide such as BSG, PSG, BPSG, USG, TEOS, or HDP-CVD oxide.

Figure 9:
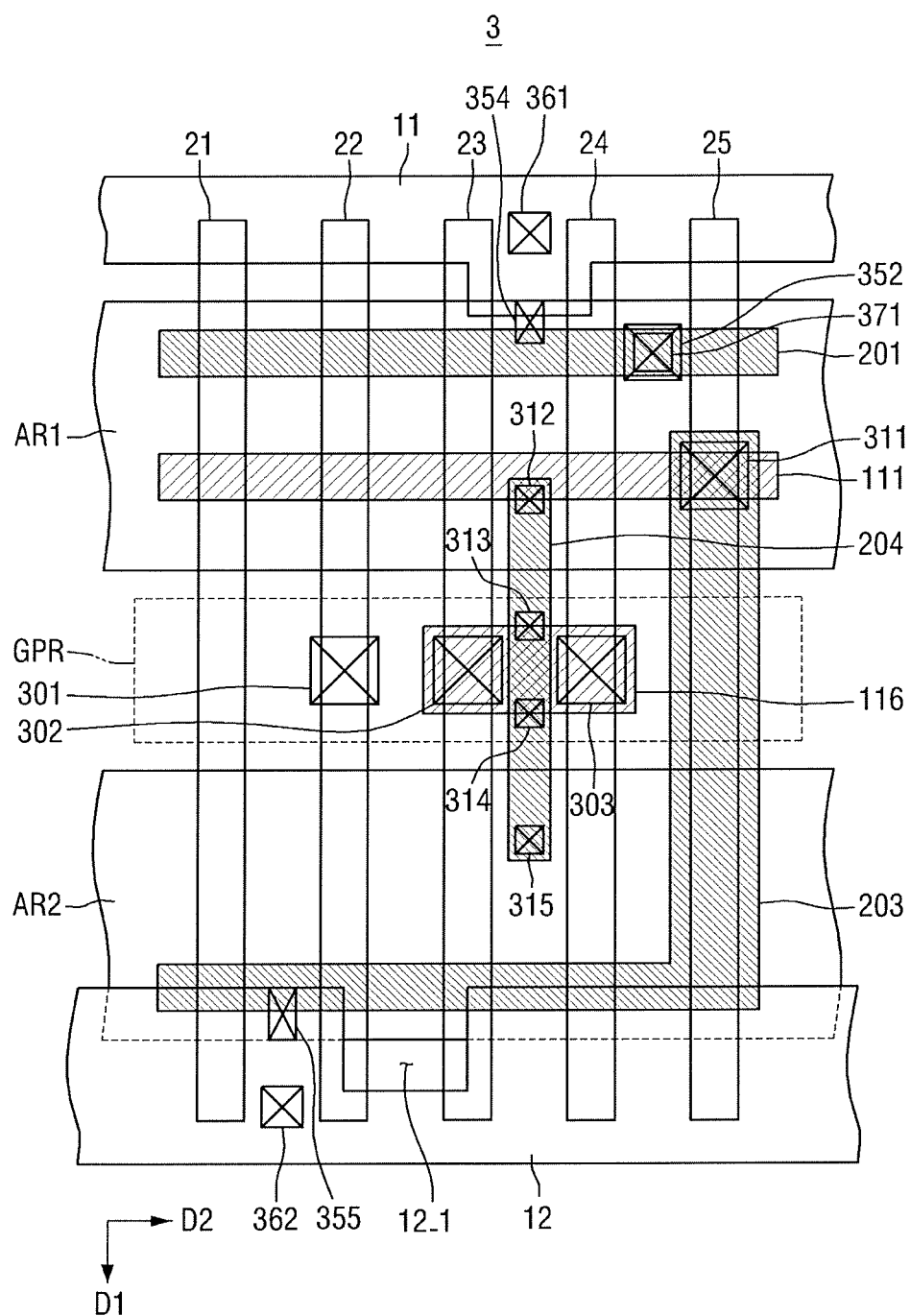
FIG. 9 is a layout view of a semiconductor device according to an example embodiment of the present inventive concept.

FIG. 9 is a layout view of a semiconductor device 3 according to an example embodiment of the present inventive concept. For simplicity, a description of elements substantially identical to those of the semiconductor devices 1 and 2 will be omitted.

Referring to FIG. 9, the semiconductor device 3 includes a substrate 10, a first active region AR1, a second active region AR2, a gate pickup region GPR, a first power rail 11, a second power rail 12, first through fifth gate lines 21 through 25, a first metal interconnect 111, a sixth metal interconnect 201, an eighth metal interconnect 203, a ninth metal interconnect 204, first through third gate contacts 301 through 303, a fourth source/drain contact 354, a fifth source/drain contact 355, and via contacts 311 through 315, 361, 362 and 371.

The semiconductor device 3 further includes the fourth source/drain contact 354 and the fifth source/drain contact 355 compared with the semiconductor devices 2 and 3. Other elements are substantially identical to those of the semiconductor devices 2 and 3.

The fourth source/drain contact 354 may overlap the first active region AR1 and a sub-pattern 11_2 of the first power rail 11. For example, the fourth source/drain contact 354 need not overlap a main pattern 11_1 of the first power rail 11. This structure of the semiconductor device 3 may further increase the area of the first power rail 11, thereby reducing the resistance of the first power rail 11 and increasing the capacitance of the first power rail 11.

An upper surface of the fourth source/drain contact 354 may lie in the same plane with an upper surface of the first power rail 11 to form a common electrode. In addition, the fourth source/drain contact 354 may be electrically connected to the first power rail 11. Therefore, signals transmitted through the first power rail 11 may be delivered to the first active region AR1. Here, since the sixth metal interconnect 201 is formed in a higher layer than the fourth source/drain contact 354, space constraints in forming the fourth source/drain contact 354 may be reduced, and the problem of a short circuit between the sixth metal interconnect 201 and the fourth source/drain contact 354 may be avoided.

The fifth source/drain contact 355 may be formed in substantially the same structure as the fourth source/drain contact 354. The fifth source/drain contact 355 may be formed on the second active region AR2 to further increase the area of the second power rail 12, thereby reducing the resistance of the second power rail 12 and increasing the capacitance of the second power rail 12.

An upper surface of the fifth source/drain contact 355 may lie in the same plane with an upper surface of the second power rail 12 to form a common electrode. In addition, the fifth source/drain contact 355 may be electrically connected to the second power rail 12. Therefore, signals transmitted through the second power rail 12 may be delivered to the second active region AR2. Here, since the eighth metal interconnect 203 is formed in a higher layer than the fifth source/drain contact 355, space constraints in forming the fifth source/drain contact 355 may be reduced, and the problem of a short circuit between the eighth metal interconnect 203 and the fifth source/drain contact 355 may be avoided.

Figure 10:
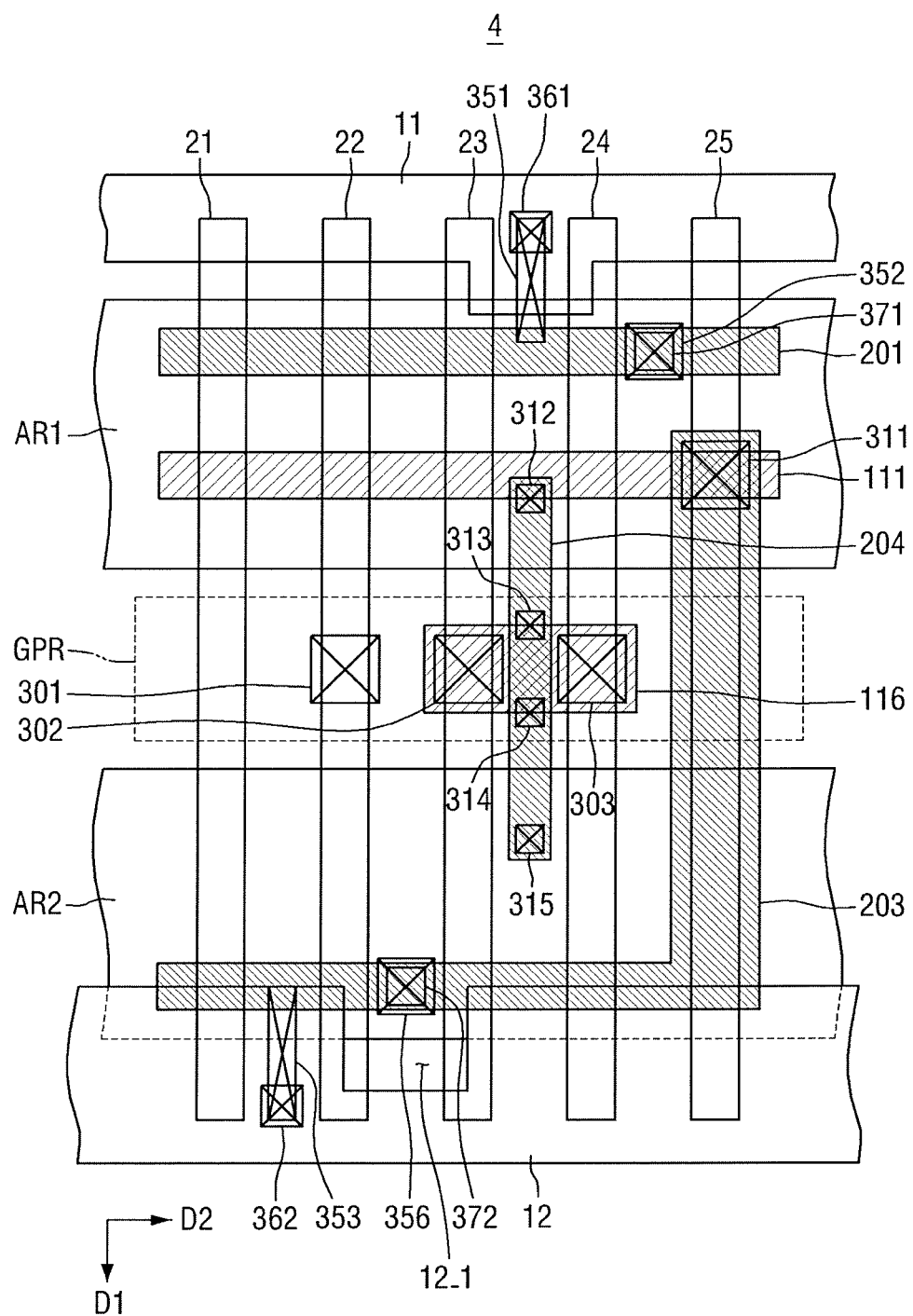
FIG. 10 is a layout view of a semiconductor device according to an example embodiment of the present inventive concept.

FIG. 10 is a layout view of a semiconductor device 4 according to an example embodiment of the present inventive concept. For simplicity, a description of elements substantially identical to those of the semiconductor devices 1 through 3 will be omitted.

Referring to FIG. 10, the semiconductor device 4 includes a substrate 10, a first active region AR1, a second active region AR2, a gate pickup region GPR, a first power rail 11, a second power rail 12, first through fifth gate lines 21 through 25, a first metal interconnect 111, a sixth metal interconnect 201, an eighth metal interconnect 203, a ninth metal interconnect 204, first through third gate contacts 301 through 303, a first source/drain contact 351, a second source/drain contact 352, a third source/drain contact 353, a sixth source/drain contact 356, and via contacts 311 through 315, 361, 362, 371 and 372.

The semiconductor device 4 further includes the sixth source/drain contact 356 and the via contact 372 compared with the semiconductor devices 1 through 3. Other elements are substantially identical to those of the semiconductor devices 1 through 3.

The sixth source/drain contact 356 may be formed at a location corresponding to a recessed region 12_1 of the second power rail 12 to be separated from the recessed region 12_1 in a first direction D1. The second power rail 12 may overlap the eighth metal interconnect 203, and the sixth source/drain contact 356 may also overlap the eighth metal interconnect 203.

Here, the sixth source/drain contact 356 is electrically connected to the eighth metal interconnect 203 by the via contact 372 but is not electrically connected to the second power rail 12. The sixth source/drain contact 356 which is not electrically connected to the second power rail 12 and is electrically connected only to the eighth metal interconnect 203 may be formed.

Figure 11:
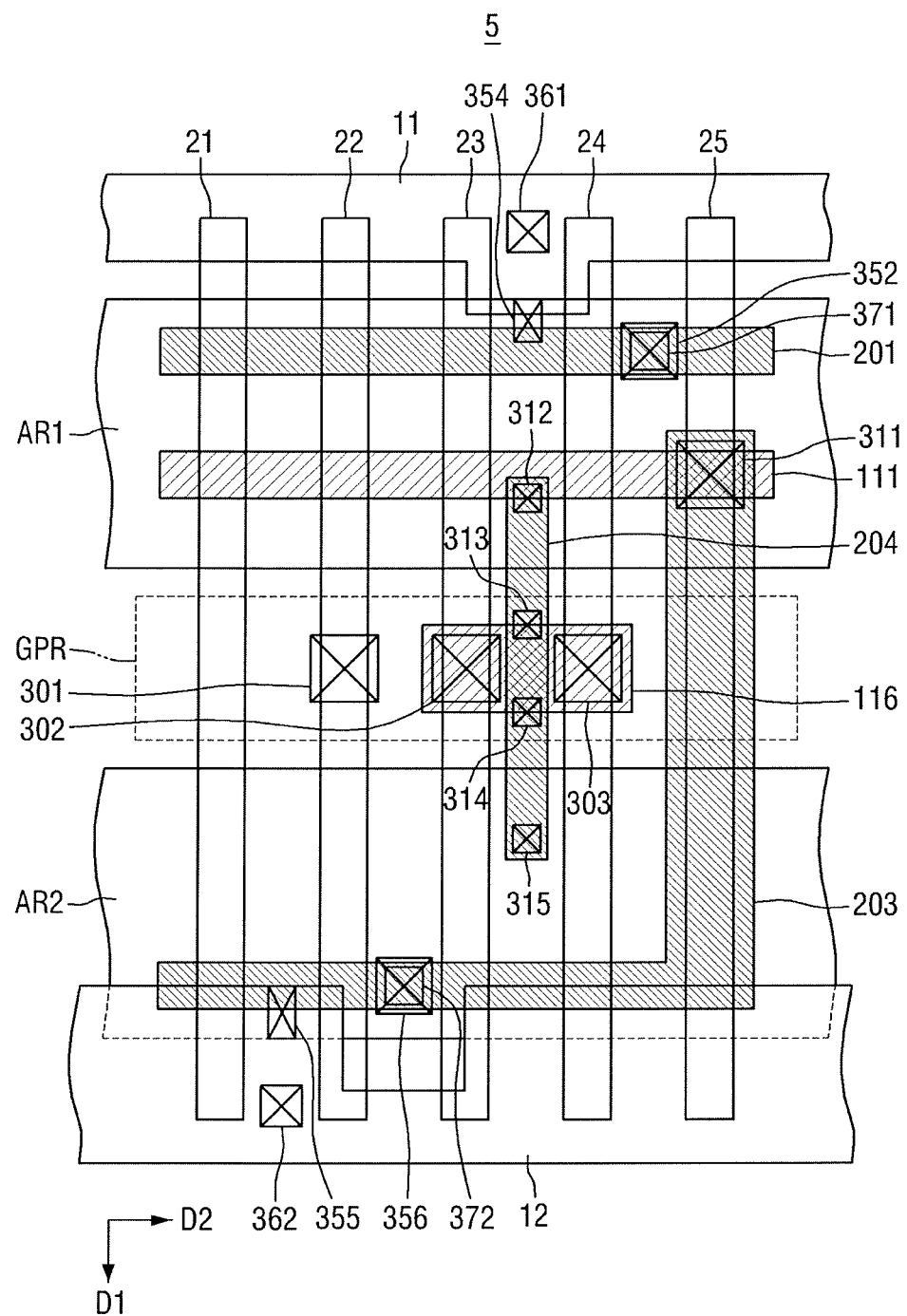
FIG. 11 is a layout view of a semiconductor device according to an example embodiment of the present inventive concept.

FIG. 11 is a layout view of a semiconductor device 5 according to an example embodiment of the present inventive concept. For simplicity, a description of elements substantially identical to those of the semiconductor devices 1 through 4 will be omitted.

Referring to FIG. 11, the semiconductor device 5 includes a substrate 10, a first active region AR1, a second active region AR2, a gate pickup region GPR, a first power rail 11, a second power rail 12, first through fifth gate lines 21 through 25, a first metal interconnect 111, a sixth metal interconnect 201, an eighth metal interconnect 203, a ninth metal interconnect 204, first through third gate contacts 301 through 303, a fourth source/drain contact 354, a fifth source/drain contact 355, a sixth source/drain contact 356, and via contacts 311 through 315, 361, 362, 371 and 372.

The semiconductor device 5 further includes the fourth source/drain contact 354, the fifth source/drain contact 355, the sixth source/drain contact 356 and the via contact 372 compared with the semiconductor devices 1 through 4. Other elements are substantially identical to those of the semiconductor devices 1 through 4.

Figure 12:
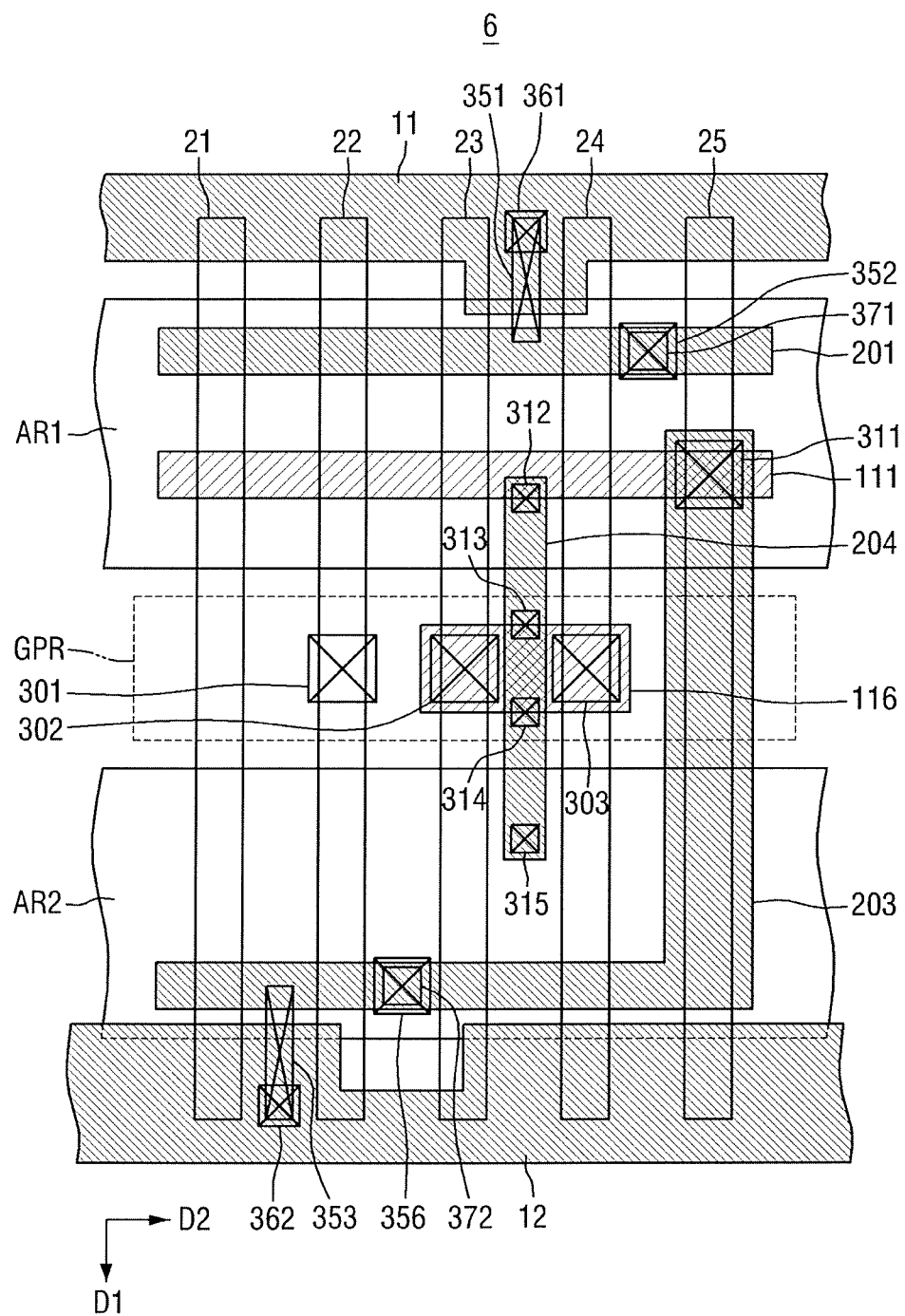
FIG. 12 is a layout view of a semiconductor device according to an example embodiment of the present inventive concept.

FIG. 12 is a layout view of a semiconductor device 6 according to an example embodiment of the present inventive concept. For simplicity, a description of elements substantially identical to those of the semiconductor devices 1 through 5 will be omitted.

Referring to FIG. 12, the semiconductor device 6 includes a substrate 10, a first active region AR1, a second active region AR2, a gate pickup region GPR, a first power rail 11, a second power rail 12, first through fifth gate lines 21 through 25, a first metal interconnect 111, a sixth metal interconnect 201, an eighth metal interconnect 203, a ninth metal interconnect 204, first through third gate contacts 301 through 303, a first source/drain contact 351, a second source/drain contact 352, a third source/drain contact 353, a sixth source/drain contact 356, and via contacts 311 through 315, 361, 362, 371 and 372.

In the semiconductor device 6, the first power rail 11 may be formed in a higher layer than the first source/drain contact 351, and the second power rail 12 may be formed in a higher layer than the second source/drain contact 352.

Accordingly, the first metal interconnect 111 located in a lower layer may set signal paths not only in a first direction D1 but also in a second direction D2, thereby increasing routability.

In addition, the sixth metal interconnect 201 and the eighth metal interconnect 203 may be formed in a higher layer than the first power rail 11 and the second power rail 12. Accordingly, the sixth metal interconnect 201 and the eighth metal interconnect 203 may set signal paths not only in the first direction D1 but also in the second direction D2, thereby increasing routability.

Figure 13:
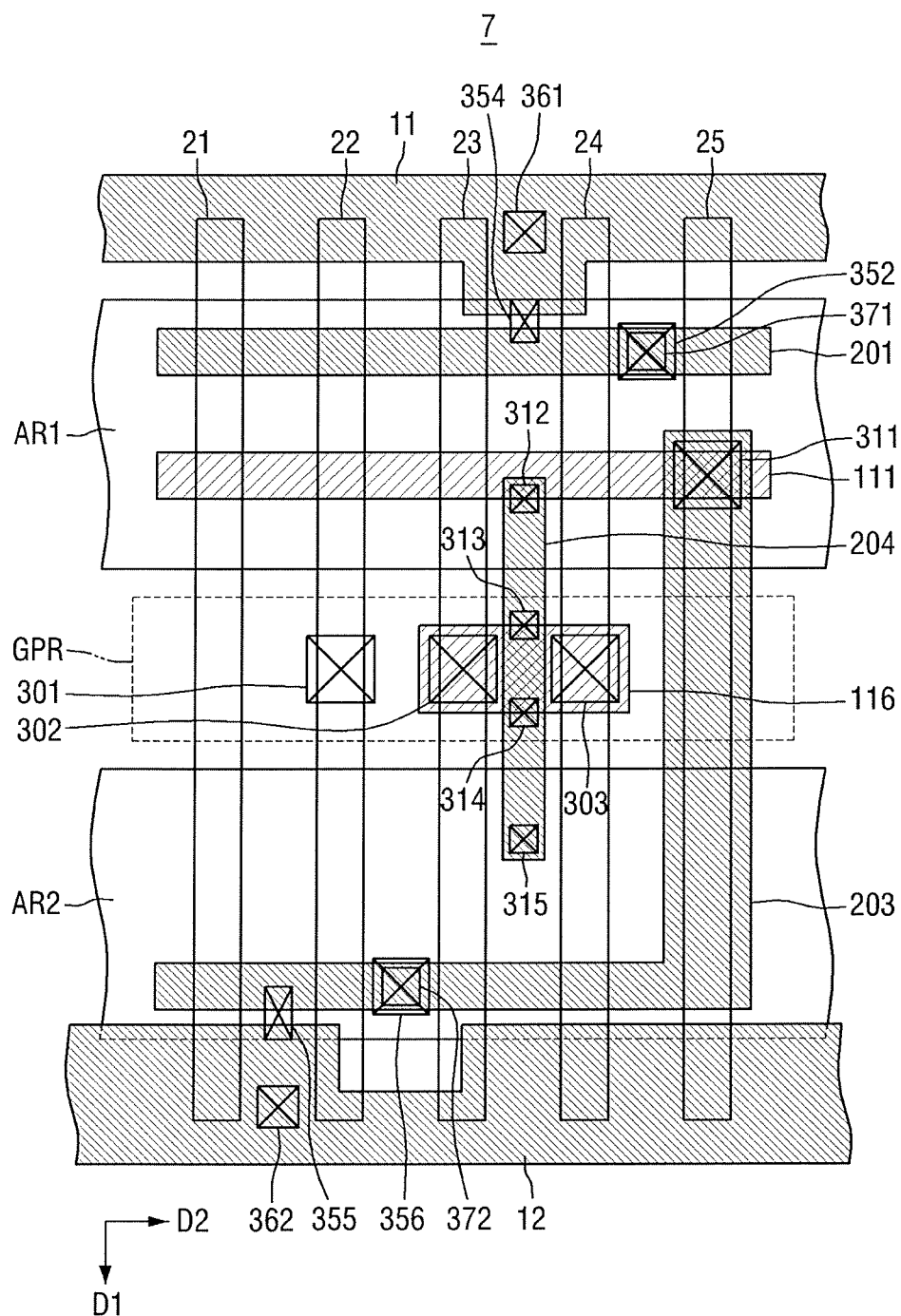
FIG. 13 is a layout view of a semiconductor device according to an example embodiment of the present inventive concept.

FIG. 13 is a layout view of a semiconductor device 7 according to an example embodiment of the present inventive concept. For simplicity, a description of elements substantially identical to those of the semiconductor devices 1 through 6 will be omitted.

Referring to FIG. 13, the semiconductor device 7 includes a substrate 10, a first active region AR1, a second active region AR2, a gate pickup region GPR, a first power rail 11, a second power rail 12, first through fifth gate lines 21 through 25, a first metal interconnect 111, a sixth metal interconnect 201, an eighth metal interconnect 203, a ninth metal interconnect 204, first through third gate contacts 301 through 303, a second source/drain contact 352, a fourth source/drain contact 354, a fifth source/drain contact 355, a sixth source/drain contact 356, and via contacts 311 through 315, 361, 362, 371 and 372.

In the semiconductor device 7, the first power rail 11 may be formed in a higher layer than the fourth source/drain contact 354, and the second power rail 12 may be formed in a higher layer than the fifth source/drain contact 355.

Accordingly, the first metal interconnect 111 located in a lower layer may set signal paths not only in a first direction D1 but also in a second direction D2, thereby increasing routability.

In addition, the sixth metal interconnect 201 and the eighth metal interconnect 203 may be formed in a higher layer than the first power rail 11 and the second power rail 12. Accordingly, the sixth metal interconnect 201 and the eighth metal interconnect 203 may set signal paths not only in the first direction D1 but also in the second direction D2, thereby increasing routability.

Figure 14:
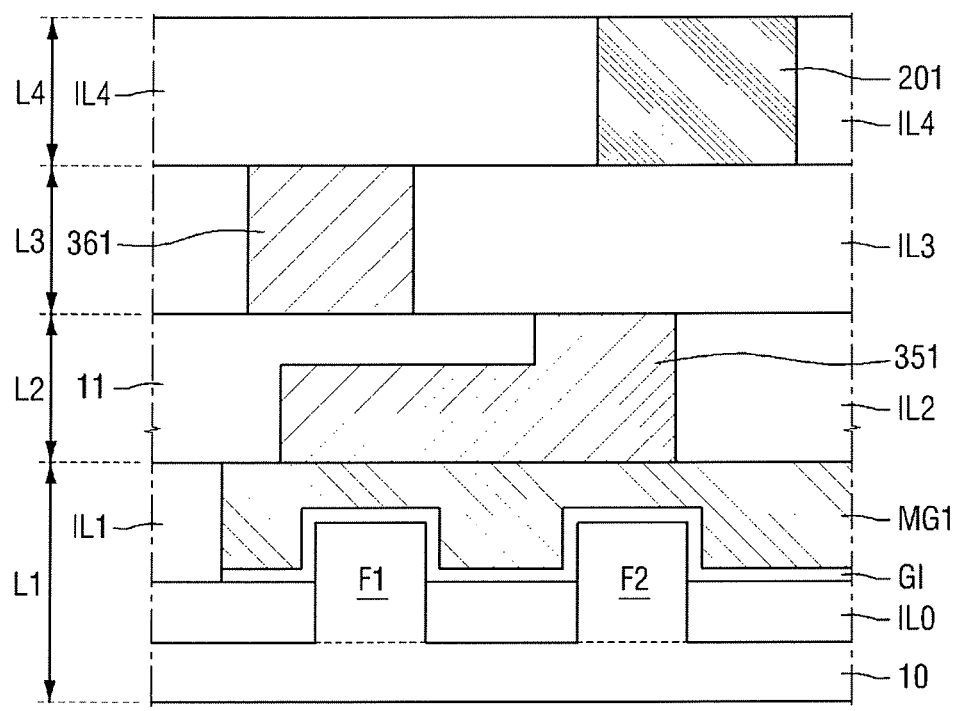
FIG. 14 is a cross-sectional view of a semiconductor device according to an example embodiment of the present inventive concept.

FIG. 14 is a cross-sectional view of a semiconductor device 8 according to an example embodiment of the present inventive concept. [Note to client: cross-sectional view of which embodiment . . . ] For simplicity, a description of elements substantially identical to those of the semiconductor devices 1 through 7 will be omitted.

Referring to FIG. 14, the semiconductor device 8 may include first and second fins F1 and F2 which protrude upward from a substrate 10. The first and second fins F1 and F2 may protrude upward from a first active region AR1. The semiconductor device 8 may further include a device isolation layer IL0 which covers part of sidewalls of the first and second fins F1 and F2 and the substrate 10.

The first fin F1 and the second fin F2 may protrude upward from the first active region AR1 of the substrate 10. The first fin F1 and the second fin F2 may be formed substantially parallel to each other.

In some example embodiments of the present inventive concept, the first and second fins F1 and F2 may be made of the same material as the substrate 10. For example, if the substrate 10 is made of Si, the first and second fins F1 and F2 may also be made of Si. However, the present inventive concept is not limited thereto, and any modification may be made. For example, the substrate 10 and the first and second fins F1 and F2 may be made of different materials. In some example embodiments of the present inventive concept, the first and second fins F1 and F2 may be formed by partially etching the substrate 10, but the present inventive concept is not limited thereto.

In some example embodiments of the present inventive concept, a cross-sectional shape of each of the first and second fins F1 and F2 may be a tapered shape (i.e., a shape which becomes wider from the bottom toward the top) or a chamfered shape (i.e., corners of each of the first and second fins F1 and F2 are rounded).

The device isolation layer IL0 may be formed on side surfaces of the first and second fins F1 and F2 and on an upper surface of the substrate 10. The device isolation layer IL0 may have, but not limited to, a shallow trench isolation (STI) structure for high-density integration having device isolation characteristics with a small occupied area. The device isolation layer IL0 may include at least one of silicon oxide, silicon nitride, silicon oxynitride, and any combination thereof.

A gate insulating layer G1 may be conformally formed on the first and second fins F1 and F2 and the device isolation layer IL0. The gate insulating layer G1 may include a high-k dielectric material having a higher dielectric constant than a silicon oxide layer. For example, the gate insulating layer G1 may include at least one of $HfO_2$, $ZrO_2$, $Ta_2O_5$, $TiO_2$, $SrTiO_3$, and $(Ba, Sr)TiO_3$. The gate insulating layer G1 may be formed to a predetermined thickness according to the type of device to be formed.

A first metal gate MG1 may be formed on the gate insulating layer G1. For example, the first through fifth gate lines 21 through 25 described above with reference to FIG. 3 may be replaced by first through fifth metal gates MG1 through MG5.

A space among the first through fifth metal gates MG1 through MG5 may be filled with a first interlayer insulating film IL1. The first interlayer insulating film IL1 may serve as electrical insulation among the first through fifth metal gates MG1 through MG5. The first interlayer insulating film IL1 may be made of silicon oxide such as BSG, PSG, BPSG, USG, TEOS, or HDP-CVD oxide. An upper surface of each of the first through fifth metal gates MG1 through MG5 and an upper surface of the first interlayer insulating film IL1 may lie in the same plane.

Figure 15:
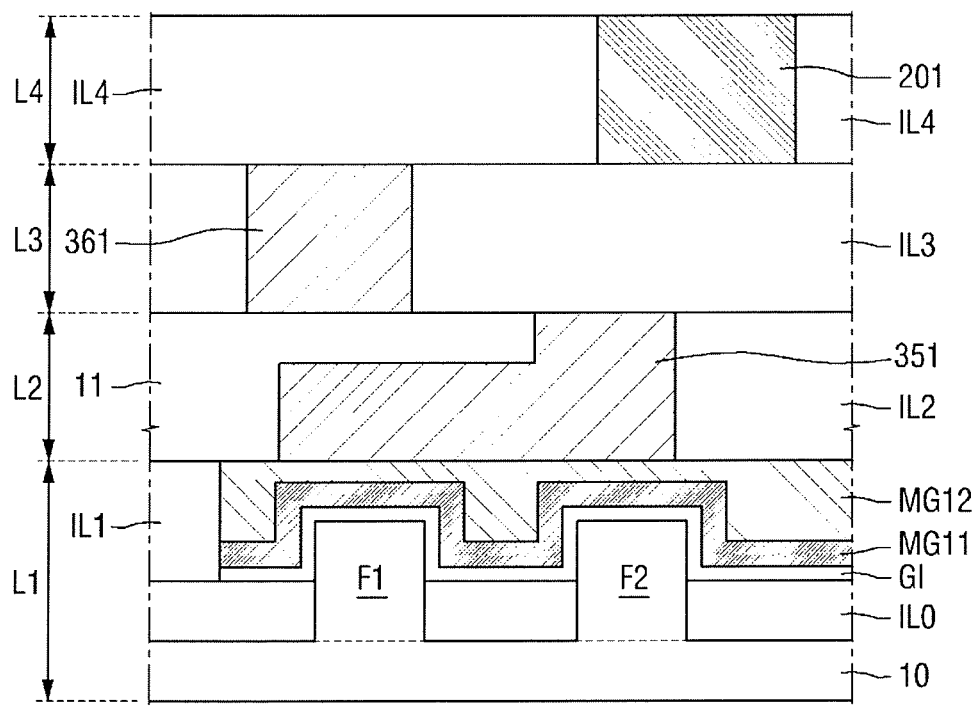
FIG. 15 is a cross-sectional view of a semiconductor device according to an example embodiment of the present inventive concept.

FIG. 15 is a cross-sectional view of a semiconductor device 9 according to an example embodiment of the present inventive concept. For simplicity, a description of elements substantially identical to those of the semiconductor devices 1 through 8 will be omitted.

Referring to FIG. 15, a first gate line 21 of the semiconductor device 9 may include first and second metal layers MG11 and MG12. Like the first gate line 21, each of second through fifth gate lines 22 through 25 may be formed by stacking two or more metal layers (MG11, MG12). The first metal layer MG11 may control a work function, and the second metal layer MG12, as a gate electrode, may fill a space formed by the first metal layer MG11.

For example, the first metal layer MG11 may include at least one of TiN, TaN, TiC, and TaC. In addition, the second metal layer MG12 may include W or Al. Alternatively, each of the first through fifth gate lines 21 through 25 may be made of a material (e.g., Si or SiGe) other than a metal. The first through fifth gate lines 21 through 25 may be formed by, but not limited to, a replacement metal gate process.

A gate insulating layer G1 may be formed between first and second fins F1 and F2 and the first metal layer MG11. The gate insulating layer G1 may be formed on upper and side surfaces of the first and second fins F1 and F2. In addition, the gate insulating layer G1 may be disposed between the first metal layer MG11 and a device isolation layer IL0. The gate insulating layer G1 may include a high-k dielectric material having a higher dielectric constant than a silicon oxide layer. For example, the gate insulating layer G1 may include $HfO_2$, $ZrO_2$, or $Ta_2O_5$.

Source or drain regions may respectively be formed on both sides of each of the first through fifth gate lines 21 through 25 and on the first fin F1 and the second fin F2. The source or drain regions may be elevated source or drain regions. Each of the elevated source or drain regions may have various shapes. For example, each of the elevated source or drain regions may have at least one of a diamond shape, a circular shape, and a rectangular shape.

Figure 16:
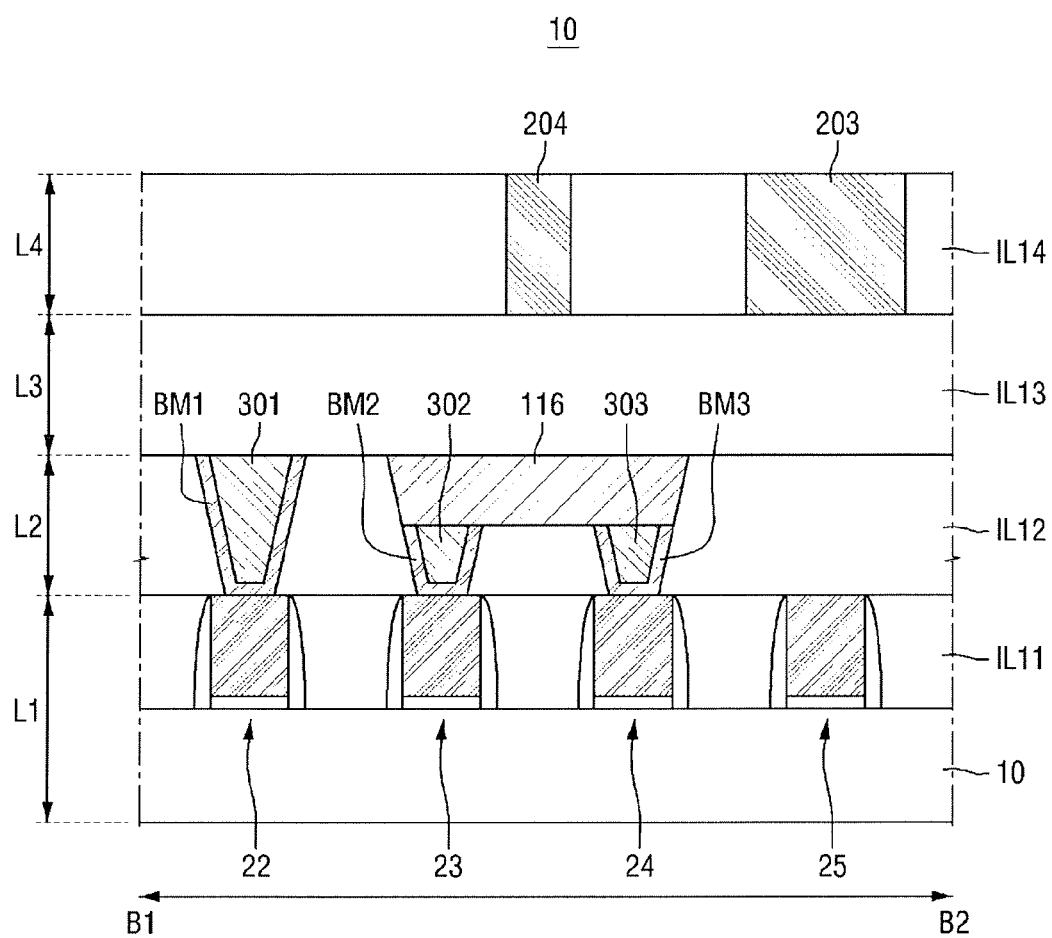
FIG. 16 is a cross-sectional view of a semiconductor device according to an example embodiment of the present inventive concept.

FIG. 16 is a cross-sectional view of a semiconductor device 10 according to an example embodiment of the present inventive concept. For simplicity, a description of elements substantially identical to those of the semiconductor devices 1 through 9 will be omitted.

Referring to FIG. 16, trenches may be formed in an interlayer insulating film IL12 of the semiconductor device 10. Barrier metals BM1 through BM3 may be conformally formed on inner surfaces of the trenches, respectively. For example, each of the barrier metals BM1 through BM may be formed to a predetermined thickness on both side surfaces and a lower surface of a corresponding trench. Alternatively, each of the barrier metals BM1 through BM may be formed to a predetermined thickness only on the lower surface of the corresponding trench. The barrier metals BM1 through BM3 may include titanium (Ti), titanium nitride (TiN), or tungsten nitride (WN). The barrier metals BM1 through BM3 may be formed by, but not limited to, physical vapor deposition (PVD), chemical vapor deposition (CVD) or interlayer dielectric (ILD) deposition.

First through third gate contacts 301 through 303 may be formed on the barrier metals BM1 through BM, respectively. The first through third gate contacts 301 through 303 may include a conductive material. For example, the first through third gate contacts 301 through 303 may include at least one of metal and polysilicon. In addition, each of the first through third gate contacts 301 through 303 may have a tapered cross-sectional shape which becomes wider from the bottom toward the top. However, the cross-sectional shape of each of the first through third gate contacts 301 through 303 is not limited to the tapered shape. In some example embodiments of the present inventive concept, the cross-sectional shape of each of the first through third gate contacts 301 through 303 may be a quadrilateral shape. In some example embodiments of the present inventive concept, the cross-sectional shape of each of the first through third gate contacts 301 through 303 may be a chamfered shape. For example, corners of each of the first through third gate contacts 301 through 303 may be rounded.

The first through third gate contacts 301 through 303 will later be selectively connected by an interconnect structure which includes a metal and a via, such that a semiconductor device according to an example embodiment of the present inventive concept may function as a logic cell.

As design rules for fabricating a semiconductor device gradually become finer, patterning becomes more difficult. Therefore, patterning should be performed in such a way to avoid a short circuit by taking into consideration the uniformity of critical dimensions, line edge roughness (LER) of patterns, and an overlay term for securing a margin to cope with the wrong formation of patterns. Therefore, according to an example embodiment, a track margin may be secured, reducing short circuits using metal interconnects disposed in upper and lower layers, and ensuring reliability.

The first to fourth layer L1 to L4 may also be referred to as a first to fourth level layer L1 to L4 in a multi-level structure of a semiconductor device according to an example embodiment of the present inventive concept. In addition, the same layer may also refer to the same level layer.

Figure 17:
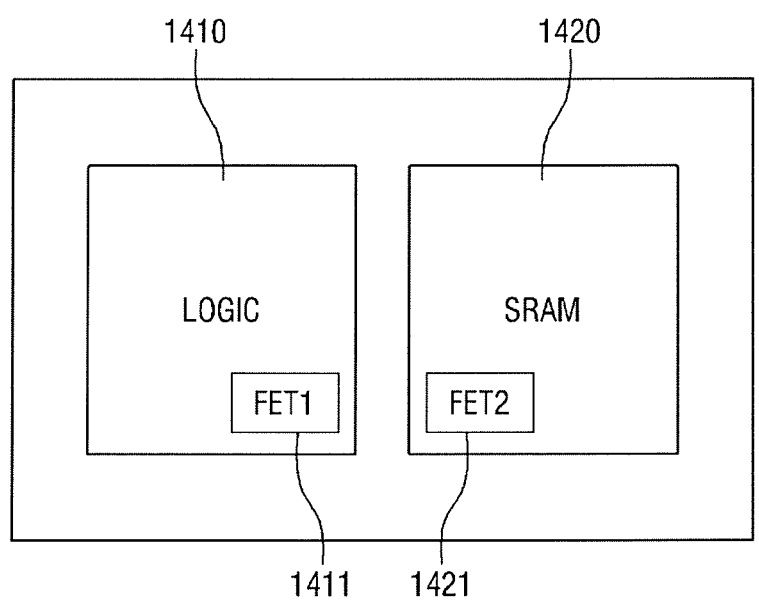
FIG. 17 is a block diagram of a semiconductor device according to an example embodiment of the present inventive concept.
Figure 18:
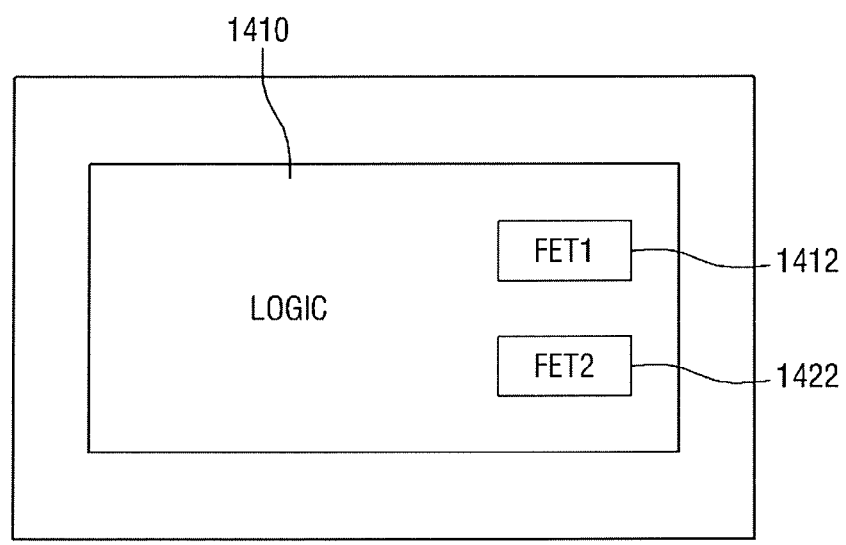
FIG. 18 is a block diagram of a semiconductor device according to an example embodiment of the present inventive concept.

FIG. 17 is a block diagram of a semiconductor device 11 according to an example embodiment of the present inventive concept. FIG. 18 is a block diagram of a semiconductor device 12 according to an example embodiment of the present inventive concept. For simplicity, a description of elements substantially identical to those of the previous embodiments will be omitted, and the current embodiments will hereinafter be described, focusing mainly on differences with the previous embodiments.

Referring to FIG. 17, the semiconductor device 11 may include a logic region 1410 and a static random access memory (SRAM) region 1420. A first transistor 1411 may be disposed in the logic region 1410, and a second transistor 1421 may be disposed in the SRAM region 1420.

In some example embodiments of the present inventive concept, the first transistor 1411 and the second transistor 1421 may have different conductivity types. In some example embodiments of the present inventive concept, the first transistor 1411 and the second transistor 1421 may have the same conductivity type. The semiconductor device 11 may include a semiconductor device according to an example embodiment of the present inventive concept.

Referring to FIG. 18, the semiconductor device 12 may include a logic region 1410. Third and fourth transistors 1412 and 1422 which are different from each other may be disposed in the logic region 1410. Although not specifically illustrated in the drawing, the third and fourth transistors 1412 and 1422 which are different from each other may also be disposed in an SRAM region.

In some example embodiments of the present inventive concept, the third transistor 1412 and the fourth transistor 1422 may have different conductivity types. In some example embodiments of the present inventive concept, the third transistor 1412 and the fourth transistor 1422 may have the same conductivity type. The semiconductor device 12 may include a semiconductor device according to an example embodiment of the present inventive concept.

In FIG. 18, the logic region 1410 and the SRAM region are illustrated as an example, but the present inventive concept is not limited to this example. The present inventive concept is also applicable to the logic region 1410 and a region where another memory (e.g., DRAM, MRAM, RRAM, PRAM, etc.) is formed.

Figure 19:
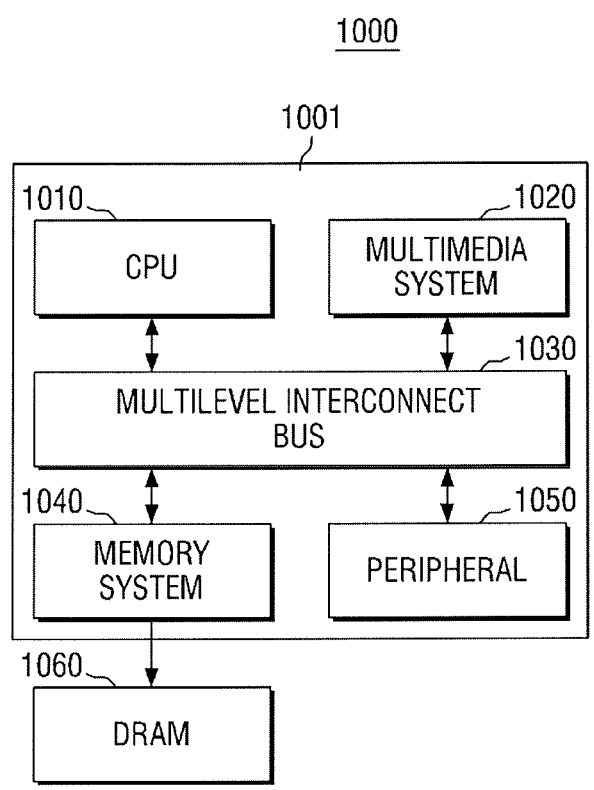
FIG. 19 is a block diagram of a system-on-chip (SoC) system including a semiconductor device according to an example embodiment of the present inventive concept.

FIG. 19 is a block diagram of a system-on-chip (SoC) system 1000 including a semiconductor device according to an example embodiment of the present inventive concept.

Referring to FIG. 19, the SoC system 1000 includes an application processor 1001 and a dynamic random access memory (DRAM) 1060.

The application processor 1001 may include a central processing unit (CPU) 1010, a multimedia system 1020, a bus 1030, a memory system 1040, and a peripheral circuit 1050.

The CPU 1010 may operate the SoC system 1000. In some example embodiments of the present inventive concept, the CPU 1010 may include a plurality of cores.

The multimedia system 1020 may be used to perform various multimedia functions in the SoC system 1000. The multimedia system 1020 may include a three dimensional (3D) engine module, a video codec, a display system, a camera system, and a post-processor.

The bus 1030 may be used for data communication among the CPU 1010, the multimedia system 1020, the memory system 1040 and the peripheral circuit 1050. In some example embodiments of the present inventive concept, the bus 1030 may have a multilayer structure. For example, the bus 1030 may be, but is not limited to, a multilayer advanced high-performance bus (AHB) or a multilayer advanced extensible interface (AXI).

The memory system 1040 may provide an environment needed for the application processor 1001 to be connected to an external memory (e.g., the DRAM 1060) and operate at high speed. In some example embodiments, the memory system 1040 may include a controller (e.g., a DRAM controller) for controlling the external memory (e.g., the DRAM 1060).

The peripheral circuit 1050 may provide an environment needed for the SoC system 1000 to smoothly connect to an external device (e.g., mainboard). Accordingly, the peripheral circuit 1050 may include various interfaces that enable the external device connected to the SoC system 1000 to be compatible with the SoC system 1000.

The DRAM 1060 may function as a working memory needed for the operation of the application processor 1001. In some example embodiments, the DRAM 1060 may be placed outside the application processor 1001 as illustrated in the drawing. For example, the DRAM 1060 may be packaged with the application processor 1001 in the form of package on package (PoP).

At least one of the elements of the SoC system 1000 may employ a semiconductor device according to an example embodiment of the present inventive concept.

Figure 20:
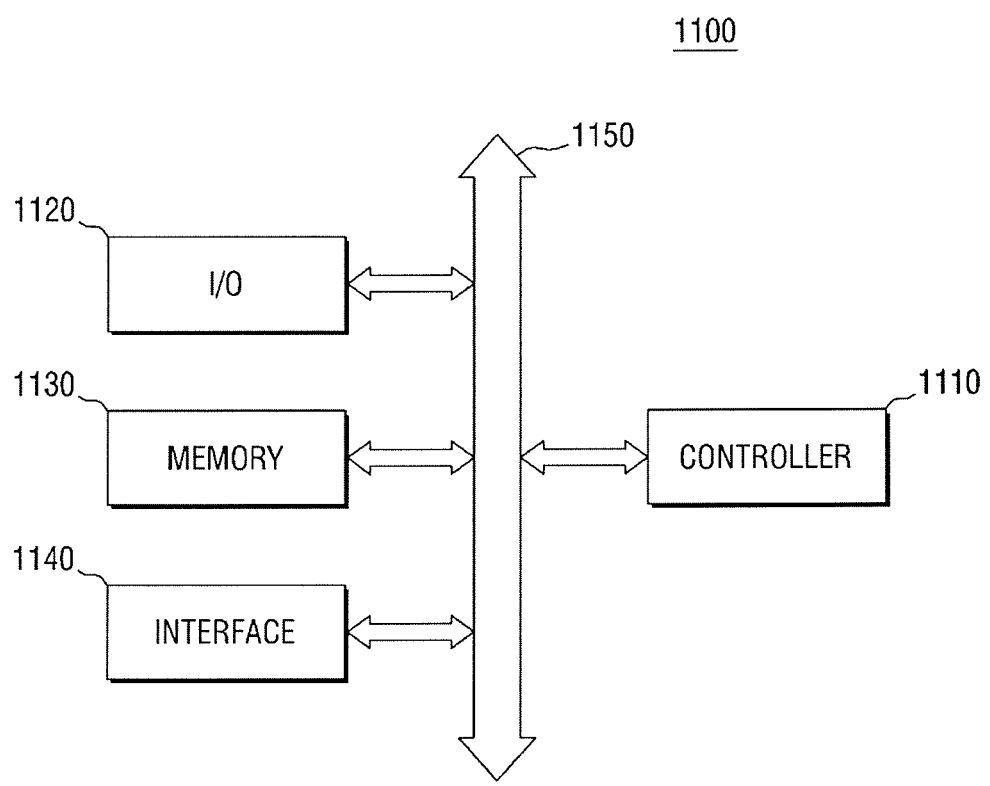
FIG. 20 is a block diagram of an electronic system including a semiconductor device according to an example embodiment of the present inventive concept.

FIG. 20 is a block diagram of an electronic system 1100 including a semiconductor device according to an example embodiment of the present inventive concept.

Referring to FIG. 20, the electronic system 1100 may include a controller 1110, an input/output (I/O) device 1120, a memory device 1130, an interface 1140 and a bus 1150.

The controller 1110, the I/O device 1120, the memory device 1130 and/or the interface 1140 may be connected to one another by the bus 1150. The bus 1150 may serve as a path for transmitting data.

The controller 1110 may include at least one of a microprocessor, a digital signal processor, a microcontroller and logic devices capable of performing similar functions to those of a microprocessor, a digital signal processor and a microcontroller. The I/O device 1120 may include a keypad, a keyboard and a display device. The memory device 1130 may store data and/or commands. The interface 1140 may be used to transmit data to or receive data from a communication network. The interface 1140 may be a wired or wireless interface. For example, the interface 1140 may include an antenna or a wired or wireless transceiver.

Although not illustrated in the drawing, the electronic system 1100 may be a working memory for improving the operation of the controller 1110, and may further include a high-speed DRAM or SRAM. Here, a semiconductor device according to an example embodiment of the present inventive concept may be employed as the working memory. In addition, a semiconductor device according to an example embodiment may be provided in the memory device 1130 or in the controller 1110 or the I/O device 1120.

The electronic system 1100 may be applied to electronic products capable of transmitting and/or receiving information in a wireless environment, such as a personal data assistant (PDA), a portable computer, a web tablet, a wireless phone, a mobile phone, a digital music player, a memory card, etc.

Figure 21:
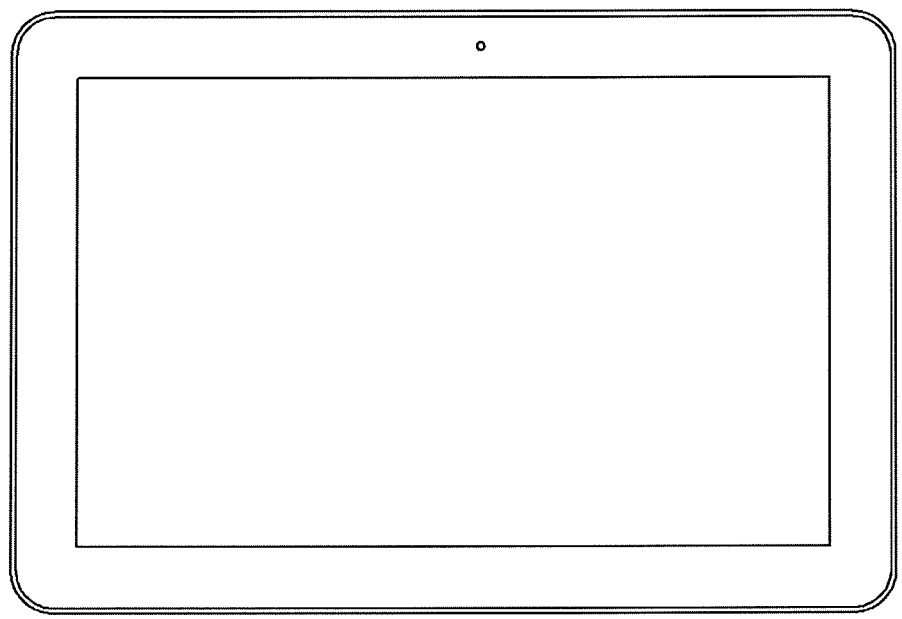
FIGS. 21 through 23 are diagrams illustrating example semiconductor systems including a semiconductor device according to an example embodiment of the present inventive concept.
Figure 22:
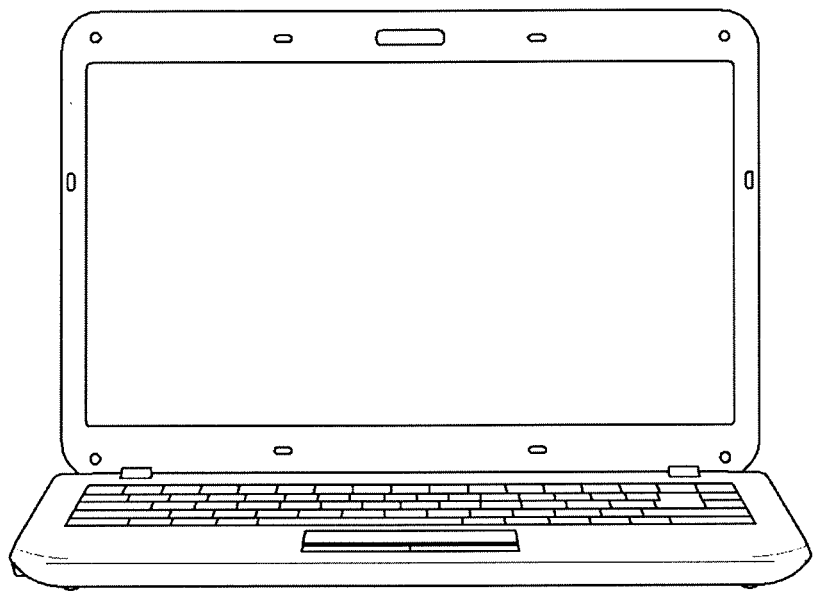
Figure 23:
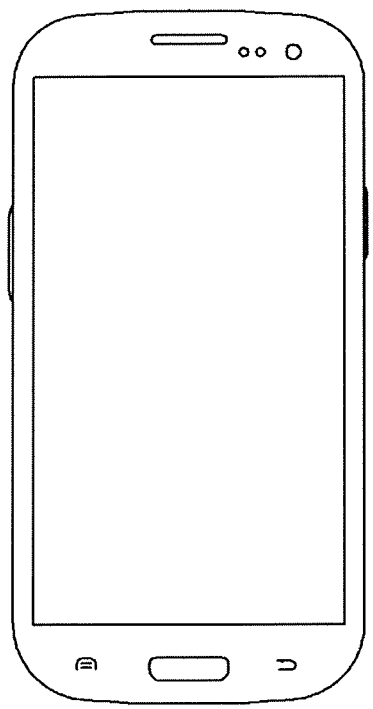

FIGS. 21 through 23 are diagrams illustrating an example semiconductor system including a semiconductor device according to an example embodiment of the present inventive concept.

FIG. 21 illustrates a tablet personal computer (PC) 1200, FIG. 22 illustrates a notebook computer 1300, and FIG. 23 illustrates a smartphone 1400. A semiconductor device according to an example embodiment of the present inventive concept, as set forth herein, may be used in the tablet PC 1200, the notebook computer 1300, and the smartphone 1400.

A semiconductor device according to an example embodiment of the present inventive concept, as set forth herein, may also be applied to various IC devices other than those set forth herein. For example, while the tablet PC 1200, the notebook computer 1300, and the smartphone 1400 have been described above as an example semiconductor system according to an example embodiment of the present inventive concept, the examples of the semiconductor system according to an example embodiment are not limited to the tablet PC 1200, the notebook computer 1300, and the smartphone 1400. In some example embodiments of the present inventive concept, the semiconductor system may be provided as a computer, an Ultra Mobile PC (UMPC), a work station, a net-book computer, a PDA, a portable computer, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, a digital video player, etc.

While the present inventive concept has been shown and described with reference to example embodiments thereof, it will be apparent to those of ordinary skill in the art that various changes in form and detail may be made therein without departing from the spirit and scope of the inventive concept as defined by the following claims.

What is claimed is:

1. A semiconductor device comprising:
   an active region extending along a first direction;
   a gate line overlapping the active region and extending along a second direction intersecting the first direction;
   a power rail having a main pattern extending along the first direction and a sub-pattern branching off from the main pattern to extend along the second direction; and
   a first source/drain contact overlapping the active region, the main pattern and the sub-pattern,
   wherein the first source/drain contact is electrically connected to the power rail,
   wherein the sub-pattern overlaps the gate line, and
   wherein the first source/drain contact does not overlap the gate line.

2. The semiconductor device of claim 1, further comprising
   a second source/drain contact disposed on the active region,
   wherein the second source/drain contact does not overlap the main pattern and the sub-pattern.

3. The semiconductor device of claim 1,
   wherein the power rail and the first source/drain contact are disposed in a first level layer.

4. The semiconductor device of claim 1,
   wherein the first source/drain contact further overlaps the main pattern.

5. The semiconductor device of claim 1,
   wherein the power rail and the first source/drain contact are disposed in a same level layer.

6. The semiconductor device of claim 1, further comprising
   a metal interconnect disposed on the first source/drain contact, vertically overlapped the first source/drain contact in a third direction intersecting the first and second direction, and the metal interconnect is spaced apart from the first source/drain contact in the third direction.

7. The semiconductor device of claim 3,
   wherein an upper surface of the power rail and an upper surface of the first source/drain contact are coplanar.

8. The semiconductor device of claim 6,
   wherein the metal interconnect overlaps the active region and is disposed adjacent to the power rail.

9. A semiconductor device comprising:
   an active region extending along a first direction;
   a gate line overlapping the active region and extending along a second direction intersecting the first direction;
   a power rail having a main pattern extending along the first direction and a recessed region recessed from the main pattern; and
   a first source/drain contact overlapping the active region and the main pattern,
   wherein the first source/drain contact is electrically connected to the power rail,
   wherein the power rail and the first source/drain contact are disposed in a same level layer, wherein the recessed region is spaced apart from the first source/drain contact, and wherein a bottom surface of the power rail is coplanar with a bottom surface of the first source/drain contact.

10. The semiconductor device of claim 9, further comprising a second source/drain contact disposed at a location surrounded by the recessed region and the main pattern.

11. The semiconductor device of claim 9, further comprising a metal interconnect disposed on the first source/drain contact, vertically overlapped the first source/drain in a third direction intersecting the first and second direction, and spaced apart from the first source/drain contact in the third direction, wherein the power rail is connected to a ground voltage.

12. The semiconductor device of claim 10, wherein the first and second source/drain contacts do not overlap the gate line.

13. A semiconductor device having multilevel layers, comprising:

a first level layer having an active region;

a second level layer having a first source/drain contact and a power rail, wherein the power rail includes a main pattern and a sub-pattern protruding from the main pattern, wherein an upper surface of the first source/drain contact is coplanar with an upper surface of the power rail; and a third level layer having a metal interconnect, wherein the metal interconnect overlaps the active region and the first source/drain contact when viewed from the above of the semiconductor device, wherein the third level layer is higher than the first level layer and the second level layer, and wherein the second level layer is higher than the first level layer.

14. The semiconductor device of claim 13, further comprising a fourth level layer having a via disposed on the power rail, wherein the fourth level layer is interposed between the second level layer and the third level layer.

15. The semiconductor device of claim 13, wherein the power rail is in contact with the first source/drain contact.

16. The semiconductor device of claim 13, further comprises:

a second source/drain contact disposed on the metal interconnect, wherein the second source/drain contact is connected electrically to the metal interconnect, and wherein the first source/drain contact is isolated from the metal interconnect by an insulation layer interposed between the metal interconnect and the first source/drain contact.

17. The semiconductor device of claim 13, wherein the first level layer, the second level layer and the third level layer are stacked perpendicular to the active region.

18. The semiconductor device of claim 15, wherein the via overlaps the main pattern and the first source/drain contact when viewed from the above of the semiconductor device.

* * * * *